United States Patent [19]

Ohashi

[11] Patent Number: 5,603,777
[45] Date of Patent: Feb. 18, 1997

[54] SUBSTRATE SURFACE TREATING APPARATUS AND SUBSTRATE SURFACE TREATING METHOD

[75] Inventor: Yasuhiko Ohashi, Shiga, Japan

[73] Assignee: Dainippon Screen Mfg. Co., Ltd., Japan

[21] Appl. No.: 467,571

[22] Filed: Jun. 6, 1995

[30] Foreign Application Priority Data

Jun. 27, 1994 [JP] Japan .................................. 6-168714

[51] Int. Cl.$^6$ .................................................. B08B 15/02
[52] U.S. Cl. ......................... 134/25.4; 134/66; 134/140; 134/902; 414/222
[58] Field of Search ................................ 134/48, 70, 71, 134/62, 61, 66, 68, 69, 76, 78, 79, 137, 140, 902, 25.4; 414/222

[56] References Cited

U.S. PATENT DOCUMENTS

| | | | |
|---|---|---|---|
| 4,715,392 | 12/1987 | Abe et al. | 134/62 |
| 4,924,890 | 5/1990 | Giles et al. | 134/902 |
| 5,072,011 | 3/1992 | Gommori et al. | 134/902 |
| 5,177,514 | 1/1993 | Ushijima et al. | 134/66 |
| 5,213,118 | 5/1993 | Kamikawa | 134/62 |
| 5,301,700 | 4/1994 | Kamikawa et al. | 134/902 |
| 5,314,509 | 5/1994 | Kato et al. | 134/902 |
| 5,381,808 | 1/1995 | Kamikawa | 134/61 |
| 5,383,482 | 1/1995 | Yamada et al. | 134/66 |
| 5,404,894 | 4/1995 | Shiraiwa | 134/66 |
| 5,445,171 | 8/1995 | Ohmori et al. | 134/902 |
| 5,485,644 | 1/1996 | Shinbara et al. | 134/902 |

FOREIGN PATENT DOCUMENTS

| | | | |
|---|---|---|---|
| 60-5530 | 1/1985 | Japan | 134/902 |
| 1-80934 | 5/1989 | Japan . | |
| 3-196626 | 8/1991 | Japan | 134/902 |
| 5-182941 | 7/1993 | Japan | 134/902 |

*Primary Examiner*—Frankie L. Stinson
*Attorney, Agent, or Firm*—Ostrolenk, Faber, Gerb & Soffen, LLP

[57] ABSTRACT

A loader station of substrate treating apparatus receives a transport cassette from a preceding stage. This transport cassette stores a plurality of substrates to be treated, arranged with a predetermined spacing therein. An empty processing cassette stands by at the loader station when the transport cassette arrives. The processing cassette is constructed to store the plurality of substrates arranged with a storage spacing that is independent of the storage spacing in the transport cassette but is optimal for surface treatment in the apparatus. In the loader station, a loader substrate transport robot transfers the substrates to be treated from the transport cassette to the empty processing cassette while absorbing any difference that may exist between the storage spacings of the respective cassettes. After being emptied, the transport cassette is transported through a transport cassette buffer to an unloader station, the now loaded processing cassette is transported to the unloader station by way of a predetermined transport path having treating baths thereal-ong for cleaning and drying the substrates in the processing cassette. In the unloader station, an unloader substrate transfer robot transfers the treated substrates from the processing cassette to an empty transport cassette while absorbing any difference there may be between the storage spacings of the respective transport and processing cassettes. After unloading of the treated substrates, the empty processing cassette is transported through a processing cassette buffer to the loading station for standby, and the transport cassette storing the treated substrates is transported from the apparatus to a next stage.

28 Claims, 14 Drawing Sheets

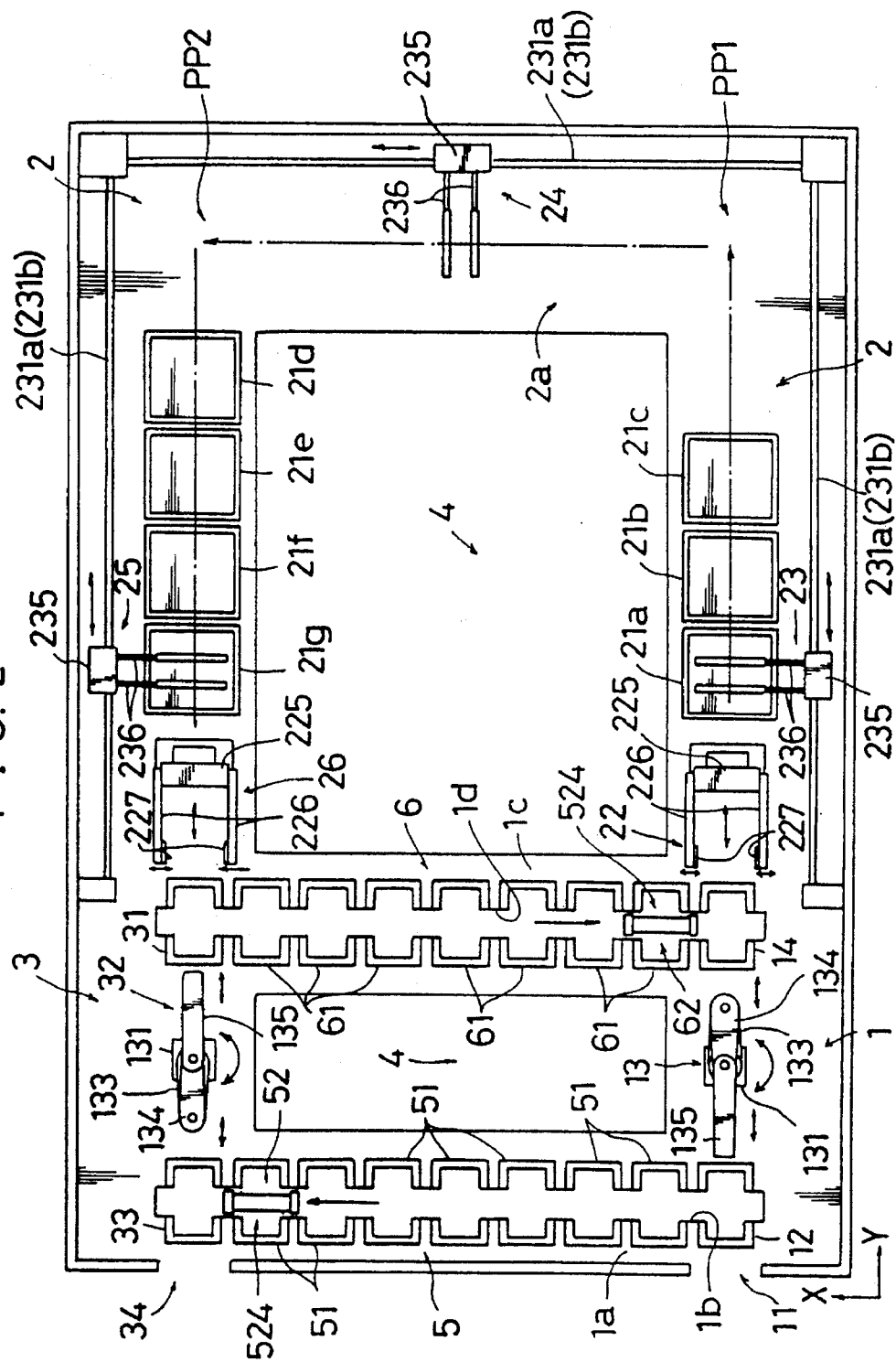

SUBSTRATE SURFACE TREATING APPARATUS AND SUBSTRATE SURFACE TREATING METHOD

BACKGROUND OF THE INVENTION

1. Field of the Invention

The present invention relates to substrate surface treating apparatus and substrate surface treating methods for cleaning, etching, peeling or otherwise treating surfaces of glass substrates for liquid crystal displays, reticles, masks, semiconductor wafers and the like (hereinafter referred to simply as "substrates"). More particularly, the invention relates to substrate surface treating apparatus and substrate surface treating methods for providing surface treatment for a plurality of substrates stored in a cassette.

2. Description of the Related Art

A substrate manufacturing process includes a plurality of surface treatments such as photoresist application, pattern printing, development, etching, cleaning and peeling. Each of these surface treatments is carried out by a separate and individual surface treating apparatus (e.g. an exposure apparatus for pattern printing, and a cleaning apparatus for cleaning).

Each surface treatment may be carried out in a piecemeal process or a batch process, depending on the type of treatment. In the piecemeal process, surface treatment is given to one substrate after another. In the batch process, surface treatment is given simultaneously to a plurality of substrates stored in a cassette.

Each surface treating apparatus is constructed according to the type of process it carries out; piecemeal process or batch process.

A prior substrate surface treating apparatus for carrying out a predetermined surface treatment (in a batch process) of a plurality of substrates stored in a cassette has been proposed by the inventor herein as disclosed in pending Japanese Utility Model Publication No. 1989-80934.

Apparatus constructed according to the instant invention has cassettes for exclusive use in transport, and cassettes for exclusive use in treatment. Each cassette for use in transport stores a plurality of substrates, and transports these substrates between this surface treating apparatus and other surface treating apparatus. Each cassette for use in treatment stores the plurality of substrates, and supports these substrates during a surface treatment given in this apparatus. First, a transport cassette storing a plurality of substrates to be treated by this apparatus is introduced into this apparatus. The substrates to be treated are transferred from the transport cassette to a treatment or processing cassette. Next, the plurality of substrates undergo treatment along with the processing cassette storing the substrates. Upon completion of the treatment, the substrates are transported from the processing cassette to either transport cassette that brought the substrates to this apparatus or to another identical transport cassette. The transport cassette storing the plurality of treated substrates is then removed from this apparatus.

According to the prior apparatus noted above, a plurality of substrates are arranged with the same spacing (i.e. storage spacing) therebetween in the processing cassette as in the transport cassette. Such an arrangement results in the following inconveniences.

In storing a plurality of substrates in a processing cassette and providing surface treatment for these substrates en bloc, it is desirable to arrange the substrates with minimum spacing, to the extent of retaining the effect of surface treatment. This will realize a small processing space in a surface treating section, and hence a small installation space of the apparatus. Thus, the processing cassettes should desirably be constructed to store substrates with optimal spacing therebetween.

However, the optimal storage spacing for substrates in the processing cassettes is not necessarily optimal storage spacing for substrates in the transport cassettes. In the prior apparatus described above, the storage spacing of the processing cassettes is governed by that of the transport cassettes. Substrates cannot be arranged with the optimal storage spacing to receive surface treatment. Consequently, if the storage spacing of the transport cassettes is larger than the optimal spacing of the processing cassettes, for example, the entire apparatus will require a large area for installation. If the storage spacing of the transport cassettes is smaller than the optimal spacing of the processing cassettes, the effect of surface treatment could diminish.

Moreover, optimal spacing is variable with the type of surface treatment, the type and size of substrates, and so on. With the prior apparatus, therefore, optimal spacing cannot be secured for all or most of the surface treatments executed in a substrate manufacturing process. Lowering the effect of each surface treatment is impermissible from the point of view of quality control. Consequently, a spacing is determined for all of the cassettes to comply with the surface treatment required for the substrate requiring the largest storage spacing. This results in the disadvantage of enlarging not only the cassettes but various surface treating baths, whereby the entire substrate surface treating apparatus requires a large area for installation.

The surface treating section of the prior apparatus includes a transport device for transporting the processing cassettes in one direction (i.e. linearly). Thus, the treating baths constituting the treating section are arranged linearly, thereby elongating the apparatus sideways to lower efficiency of floor area utilization. Such a construction must provide maintenance areas along the respective treating baths, which enlarge the entire apparatus.

Further, the prior apparatus includes storage shelves for depositing the transport cassettes and processing cassettes. The cassettes are selectively deposited on the shelves and retrieved therefrom in accordance with the progress of treatment. However, this construction complicates the treating process, and requires an elaborate mechanism for depositing the cassettes on the shelves and retrieving the cassettes therefrom.

SUMMARY OF THE INVENTION

The present invention has been made having regard to the state of the art noted above, and its primary object is to provide a substrate surface treating apparatus and substrate surface treating method for providing surface treatment for substrates arranged with optimal spacing therebetween, without being governed by storage spacing within transport cassettes.

Another object of the invention is to provide a compact substrate surface treating apparatus for fulfilling the above primary object.

A further object of the invention is to provide transport cassettes and processing cassettes of simple construction which may be used efficiently in the apparatus and method for fulfilling the above primary object.

The above objects are fulfilled, according to the present invention, by a surface treating apparatus that provides surface treatment for a plurality of substrates stored in a cassette, the apparatus comprising:

a transport cassette transfer station for supporting a transport cassette adapted to store the plurality of substrates arranged with a first storage spacing;

a processing cassette transfer station for supporting a processing cassette adapted to store the plurality of substrates arranged with a second storage spacing;

a substrate transfer device for transferring the plurality of substrates between the transport cassette at the transport cassette transfer station and the processing cassette at the processing cassette transfer station, such that the substrates are stored in the transport cassette and the processing cassette with the first storage spacing and the second storage spacing, respectively;

a surface treating section for providing surface treatment for the plurality of substrates stored in the processing cassette; and a surface treatment transport device for transporting the processing cassette storing the plurality of substrates to be treated, after a substrate transfer by the substrate transfer device from the transport cassette to the processing cassette, from the processing cassette transfer station through the surface treating section to the processing cassette transfer station.

With this apparatus, the substrate transfer device transfers a plurality of substrates to be treated from a transport cassette introduced into the transport cassette transfer station, to an empty processing cassette at the processing cassette transfer station. At this time, the substrates are arranged in the processing cassette with a predetermined storage spacing optimal for the surface treatment. The surface treatment transport device transports the processing cassette storing the plurality of substrates to be treated, from the processing cassette transfer station through the surface treating section to the processing cassette transfer station. In the surface treating section, the plurality of substrates stored in the processing cassette receive the surface treatment along with the processing cassette. Subsequently, the substrate transfer device transfers the plurality of treated substrates from the processing cassette transported to the processing cassette transfer station, to an empty transport cassette at the transport cassette transfer station. At this time, the substrates are arranged in the transport cassette with the storage spacing of the transport cassette.

In this way, the substrate transfer device transfers the substrates in a way to accommodate the storage spacings of the transport cassette and processing cassette. Thus, the surface treatment may be effected for the plurality of substrates arranged in the processing cassette with the storage spacing optimal for the surface treatment, without being governed by the storage spacing of the transport cassette. This allows the surface treating section to have a reduced size, to achieve compactness of the apparatus, without impairing the effect of surface treatment given to the substrates.

Further, since the surface treatment is carried out for a plurality of substrates stored in the processing cassette, the apparatus achieves an improved throughput over a piecemeal process. Besides, when handling large substrates, the apparatus can prevent damage done to the substrates during the surface treatment and transport.

This apparatus uses the transport cassette and processing cassette, whereby the transport that may become contaminated outside the apparatus is kept out of the surface treating section. This minimizes the chance of contaminating the interior of the surface treating section.

The present invention also provides a surface treating method for providing surface treatment for a plurality of substrates stored in a cassette, the method comprising the steps of:

transferring the plurality of substrates to be treated, which are stored in a transport cassette with a first storage spacing, from the transport cassette to an empty processing cassette to be stored therein with a second storage spacing;

transporting the processing cassette, after transfer of the substrates to be treated, to a surface treating section for providing surface treatment for the plurality of substrates along with the processing cassette; and transferring the plurality of treated substrates from the processing cassette to an empty transport cassette to be stored therein with the first storage spacing.

With this method, as with the surface treating apparatus described above, surface treatment is provided for a plurality of substrates arranged in the processing cassette with the storage spacing optimal for the surface treatment, without being governed by the storage spacing of the transport cassette. This allows the surface treating section to have a reduced size, to achieve compactness of the apparatus, without impairing the effect of surface treatment given to the substrates.

In the surface treating apparatus described above, the substrate transfer device may include;

a substrate withdrawing and inserting device for horizontally withdrawing the substrates in succession from one of the transport cassette and the processing cassette, and horizontally inserting the substrates into the other of the transport cassette and the processing cassette; and a vertical displacement device for vertically displacing the substrate withdrawing and inserting device.

The substrate withdrawing and inserting device horizontally withdraws one substrate from one cassette, and horizontally stores the substrate in a predetermined position in the other cassette. In transferring each substrate in this way, the substrate storing positions in the respective cassettes are vertically displaced from each other as a result of the difference in the storage spacings of the two cassettes. The vertical displacement device vertically displaces the substrate withdrawing and inserting device (i.e. the substrate withdrawn), after the substrate withdrawing and inserting device horizontally withdraws the substrate from one cassette and before the substrate withdrawing and inserting device horizontally inserts the substrate into the other cassette. In this way, the vertical displacement between the substrate storing positions in the respective cassettes is absorbed.

Preferably, the transport cassette transfer station includes a transport cassette loader transfer station, and a transport cassette unloader transfer station;

the processing cassette transfer station includes a processing cassette loader transfer station and a processing cassette unloader transfer station;

the substrate transfer device includes a loader substrate transfer device for transferring the plurality of substrates to be treated from the transport cassette at the transport cassette loader transfer station to an empty processing cassette at the processing cassette loader transfer station to be stored therein with the second storage spacing, and an unloader substrate transfer device for transferring the plurality of treated substrates from the processing cassette at the processing cassette unloader transfer station to an empty transport cassette at the transport cassette unloader transfer station to be stored therein with the first storage spacing; and the surface treatment transport device is operable to transport the processing cassette storing the plurality of substrates to be treated, after the substrate transfer by the loader substrate transfer device, from the processing cassette loader transfer station through the surface treating section to the processing cassette unloader transfer station.

This construction allows independent execution of an operation to transfer the substrates to be treated from the transport cassette to the processing cassette, and an operation to transfer the treated substrates from the processing cassette to the transport cassette, without a conflict between the two transfer operations. Thus, the series of treating steps may be carried out smoothly without a wasteful waiting time, to improve the throughput of the treatment.

The surface treating apparatus may comprise a transport cassette delivery section for passing the transport cassette storing the plurality of substrates between an exterior of the surface treating apparatus and the transport cassette transfer station;

the transport cassette delivery section including a transport cassette loader delivery section for passing the transport cassette storing the plurality of substrates to be treated between the exterior of the surface treating apparatus and the transport cassette loader transfer station, and a transport cassette unloader delivery section for passing the transport cassette storing the plurality of treated substrates between the exterior of the surface treating apparatus and the transport cassette unloader transfer station.

With this construction, the transport cassette delivery section passes the transport cassette storing the plurality of substrates to be treated, arranged with the predetermined storage spacing therebetween, from outside the apparatus to the transport cassette transfer station. Further, the transport cassette delivery section passes the transport cassette storing the plurality of treated substrates arranged with the predetermined storage spacing therebetween, from the transport cassette transfer station outwardly of the apparatus. The introduction of the transport cassette storing the substrates to be treated, and the removal of the transport cassette storing the treated substrates, are carried out independently of each other.

Consequently, there occurs no conflict between the operation to introduce the transport cassette and the operation to remove the transport cassette. The series of treating steps may be carried out smoothly without a wasteful waiting time, to promote the throughput of the treatment.

Preferably, the surface treatment transport device has a transport path with a transport direction turned back in an intermediate region, the transport cassette loader delivery section, the transport cassette loader transfer station, the loader substrate transfer device, the processing cassette loader transfer station, the surface treating section, the processing cassette unloader transfer station, the unloader substrate transfer device, the transport cassette unloader transfer station and the transport cassette unloader delivery section being arranged along the transport path.

This arrangement results in an apparatus having a reduced sideways length and an improved efficiency of floor area utilization. Further, it is possible with this arrangement to provide piping/maintenance areas centrally of the apparatus to achieve compactness.

The surface treating apparatus may further comprise:

a transport cassette buffer disposed between the transport cassette loader transfer station and the transport cassette unloader transfer station for maintaining the empty transport cassette in standby; and a transport cassette transport device for transporting the empty transport cassette, after the substrate transfer by the loader substrate transfer device, from the transport cassette loader transfer station through the transport cassette buffer to the transport cassette unloader transfer station.

The transport cassette transport device transports the empty transport cassette, after the substrate transfer, from the transport cassette loader transfer station through the transport cassette buffer to the transport cassette unloader transfer station. In parallel with this transportation of the empty transport cassette, the surface treatment is provided for the substrates stored in the processing cassette. The treated substrates are transferred to the empty transport cassette transported to the transport cassette unloader transfer station, and are transported out of the apparatus. That is, the transport cassette used for introducing the substrates may be used also for transporting the substrates out of the apparatus, whereby the transport cassette is used efficiently. When a time lag occurs between the transportation of the empty transport cassette and the surface treatment, the empty transport cassette may be kept on the transport cassette buffer for standby.

The surface treating apparatus may further comprise:

a processing cassette buffer disposed between the processing cassette loader transfer station and the processing cassette unloader transfer station for maintaining the empty processing cassette in standby; and a processing cassette transport device for transporting the empty processing cassette, after the substrate transfer by the unloader substrate transfer device, from the processing cassette unloader transfer station through the processing cassette buffer to the processing cassette loader transfer station.

The processing cassette transport device transports the empty processing cassette, after the treated substrates are transferred to the transport cassette, from the processing cassette unloader transfer station through the processing cassette buffer to the processing cassette loader transfer station. That is, the processing cassette may be used cyclically in the apparatus, whereby the processing cassette is used efficiently. The processing cassette is constantly maintained within the apparatus, and hence free from contamination outside the apparatus. This minimizes the possibility of the processing cassette contaminating the substrates. The empty processing cassette may have to stand idle when a time lag occurs between the transportation of the empty processing cassette to the processing cassette loader station and the transportation of the transport cassette to the transport cassette loader station. In such a case, the empty processing cassette may be kept on the processing cassette buffer for standby.

The transport cassette buffer may include a transport cassette cleaning section for cleaning the empty transport cassette, the empty transport cassette being cleaned in the transport cassette cleaning section while the transport cassette transfer device transports the empty transport cassette from the transport cassette loader transfer station to the transport cassette unloader transfer station. According to this construction, the treated substrates are stored in the cleaned transport cassette. Even if the transport cassette entering the apparatus has impurities adhering thereto, such impurities are not passed on to the treated substrates. This minimizes the possibility of the transport cassette contaminating the substrates.

The processing cassette buffer may include a processing cassette cleaning section for cleaning the empty processing cassette, the empty processing cassette being cleaned in the processing cassette cleaning section while the processing cassette transfer device transports the empty processing cassette from the processing cassette unloader transfer station to the processing cassette loader transfer station. According to this construction, the surface treatment is provided for the substrates stored in the cleaned processing cassette, which provides a further assurance against contamination of the substrates by the processing cassette.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIG. 2 is a plan view showing an interior of the apparatus of the first embodiment;

DETAILED DESCRIPTION OF THE PREFERRED EMBODIMENTS

Preferred embodiments of the present invention will be described in detail hereinafter with reference to the drawings.

First Embodiment

The first and subsequent embodiments which will be described, exemplify one type of substrate surface treating apparatus for cleaning square glass substrates for liquid crystal displays (hereinafter referred to simply as "substrates").

Figure 1:
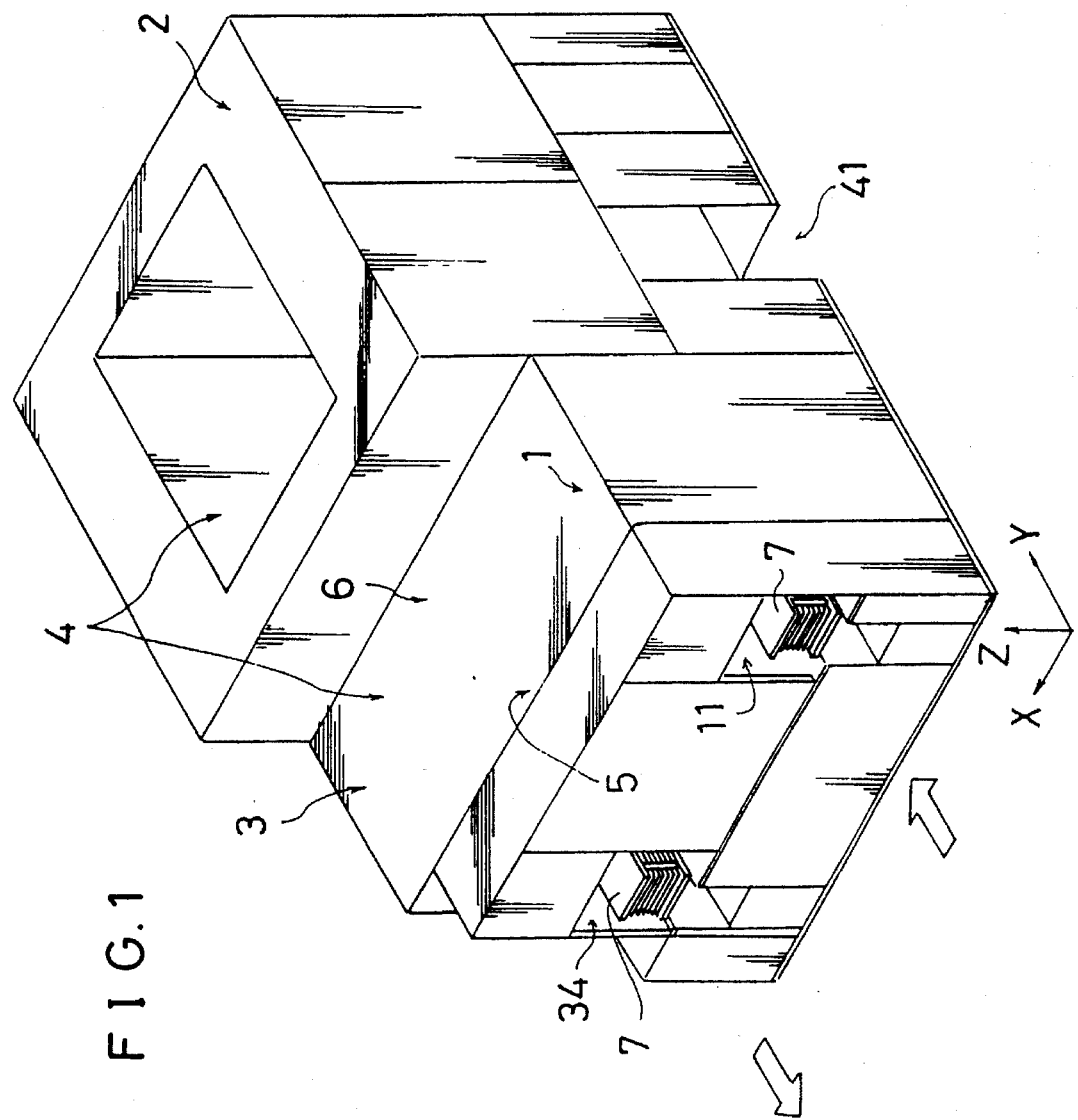
FIG. 1 is a perspective of a substrate surface treating apparatus according to a first embodiment of the present invention.

Referring to FIGS. 1 and 2, broadly the apparatus according to the first embodiment includes a loader station 1, a surface treating section 2, an unloader station 3, piping/maintenance areas 4, a transport cassette buffer 5 and a processing cassette buffer 6. As shown in FIG. 1, these components 1–6 are enclosed fluid-tight in a housing with a highly clean atmosphere maintained inside.

Before describing the foregoing components 1–6, transport cassettes 7 and processing cassettes 8 used in this apparatus will be described with reference to FIGS. 3A, 3B and 3C and FIGS. 4A, 4B and 4C.

The transport cassettes 7 are used for transporting substrates W from a preceding stage of treatment to this apparatus to be cleaned, and transporting cleaned substrates W from this apparatus to a next stage of treatment. Each transport cassette 7 stores a plurality of substrates W arranged with storage spacing p1 therebetween.

Figure 3A:
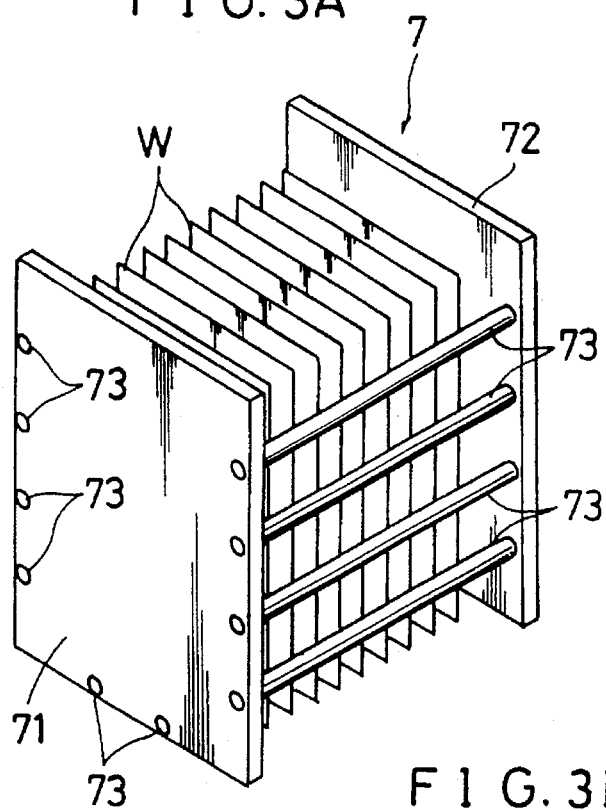
FIGS. 3A, 3B and 3C are views of a transport cassette, with FIGS. 3A and 3C being perspectives and FIG. 3B being a plan view.
Figure 3C:
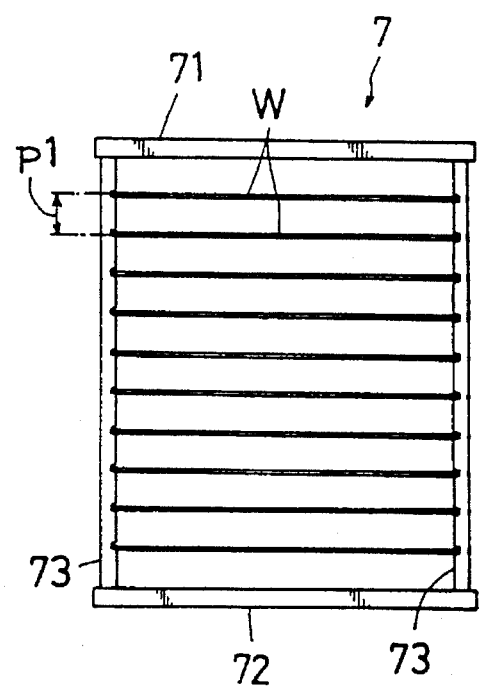
Figure 3B:
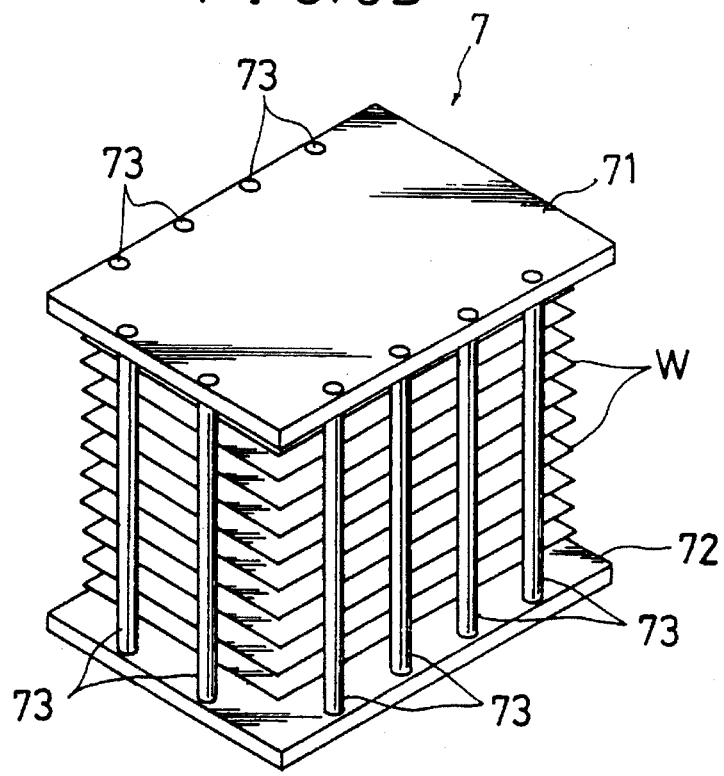

Specifically, as shown in FIGS. 3A and 3B, each transport cassette 7 is formed of two plates 71 and 72, and ten connecting cross rods 73 extending therebetween—four at each side and two at the bottom. As shown in FIG. 3C, each rod 73 defines grooves facing inwardly to hold substrates W arranged with storage spacing p1 (e.g. 14 to 16 mm) therebetween.

The processing cassettes 8 are used for storing substrates W during the surface treatment (cleaning) given by this apparatus. Each processing cassette 8 stores a plurality of substrates W arranged with storage spacing p2 therebetween.

Figure 4A:
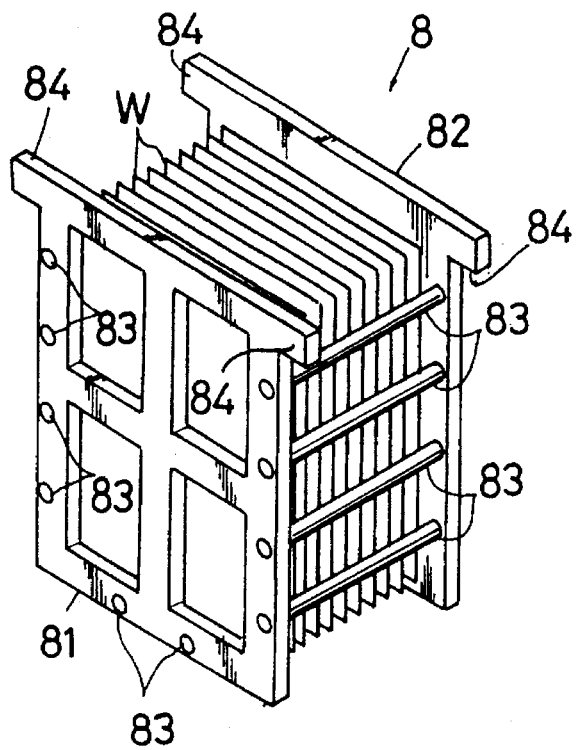
FIGS. 4A, 4B and 4C are views of a processing cassette, with FIGS. 4A and 4C being perspectives and FIG. 4B being a plan view.
Figure 4C:
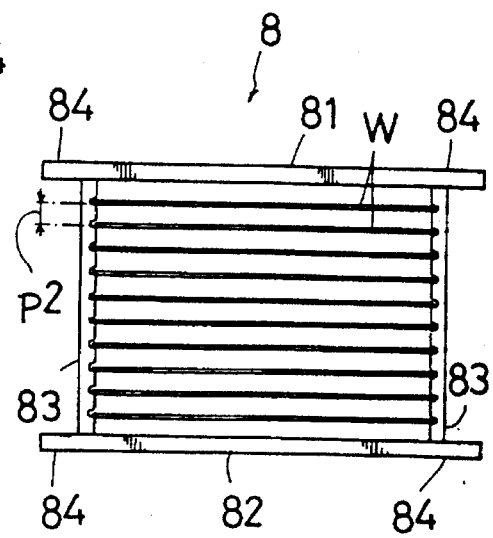
Figure 4B:
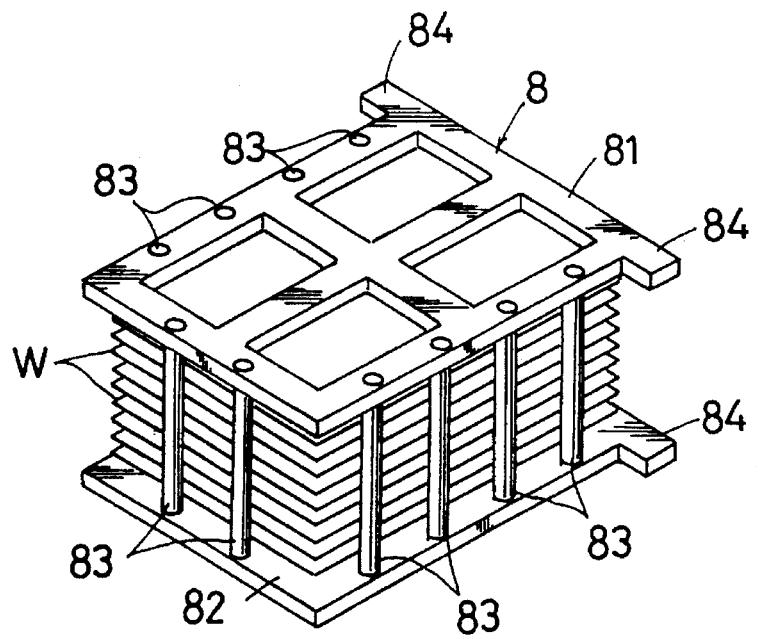

Specifically, as shown in FIGS. 4A and 4B, each processing cassette 8 is formed of two plates 81 and 82 each defining openings, and ten connecting cross rods 83 extending therebetween—four at each side and two at the bottom. Each plate 81 or 82 includes lugs 84 for engaging hooks and hangers of surface treatment robots 23, 24 and 25 in the surface treating section 2 as described hereinafter. As shown in FIG. 4C, each rod 83 defines grooves facing inwardly to hold substrates W arranged with storage spacing p2 (e.g. 8.5 to 10 mm) therebetween.

The storage spacing p2 is determined based on the type, size and the like of the substrates W to be cleaned in the surface treating section 2, such that the plurality of substrates W are arranged at minimum intervals (optimal spacing) within a range for assuring the cleaning effect.

In this embodiment, the storage spacing p1 of the transport cassettes 7 is larger than the storage spacing p2 of the processing cassettes 8 (p1>p2). FIGS. 3A, 3B and 3C and FIGS. 4A, 4B and 4C show ten substrates W stored in each cassette 7 or 8, but the number of substrates W stored in each cassette 7 or 8 is not limited to ten.

Next, the components 1–6 of this apparatus will be described, along with operation of the apparatus.

Figure 5:
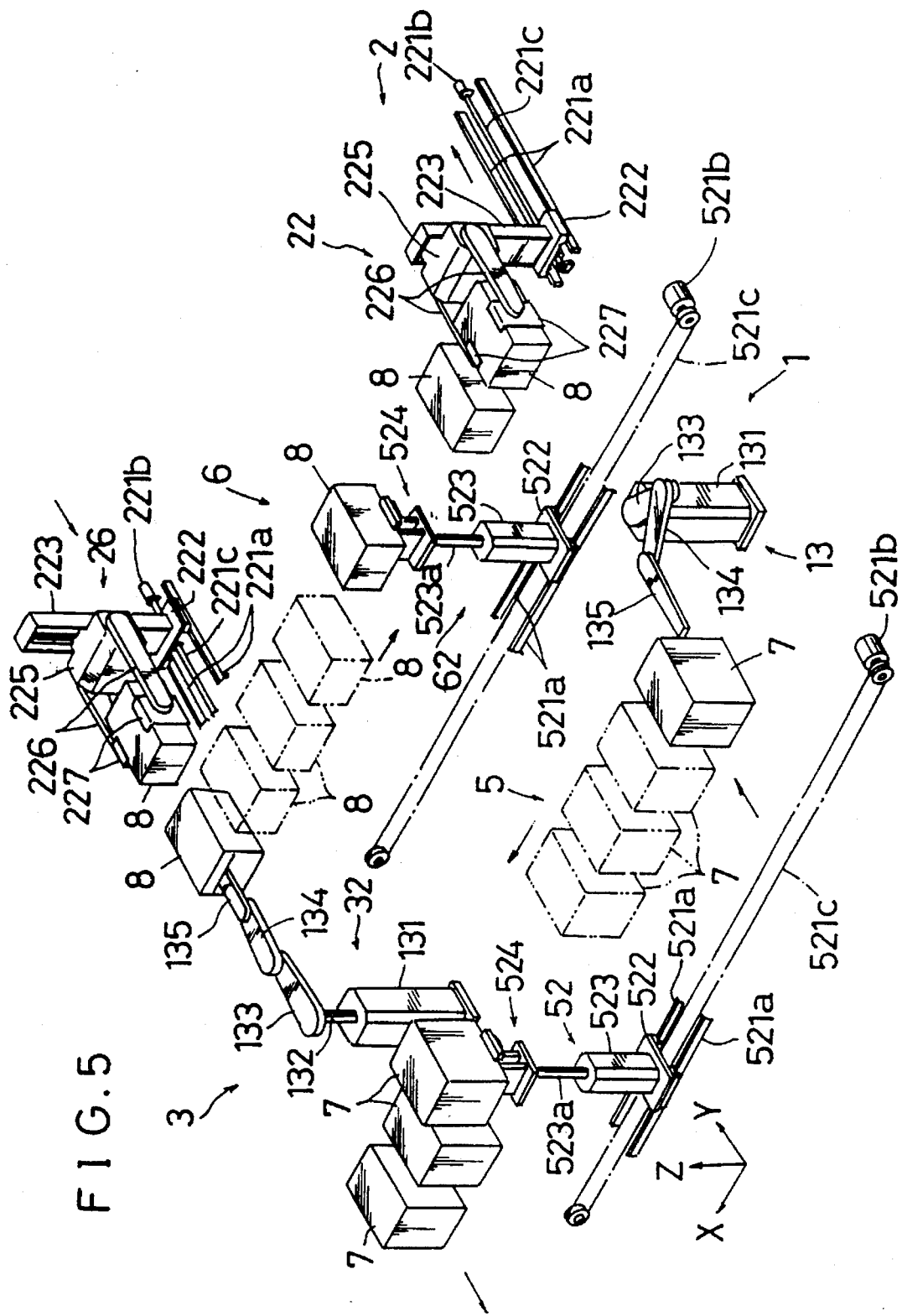
FIG. 5 is a fragmentary perspective of the apparatus in the first embodiment, including a loader station and an unloader station.
Figure 6:
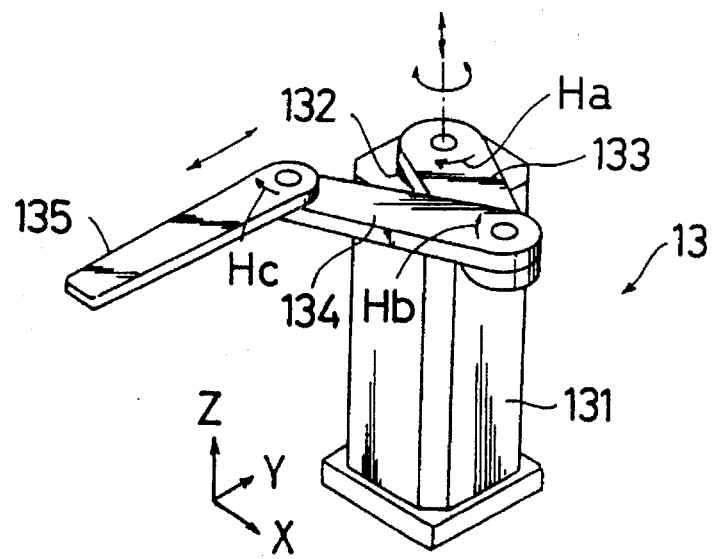
FIG. 6 is a perspective of a substrate transfer robot of the loader station.
Figure 7:
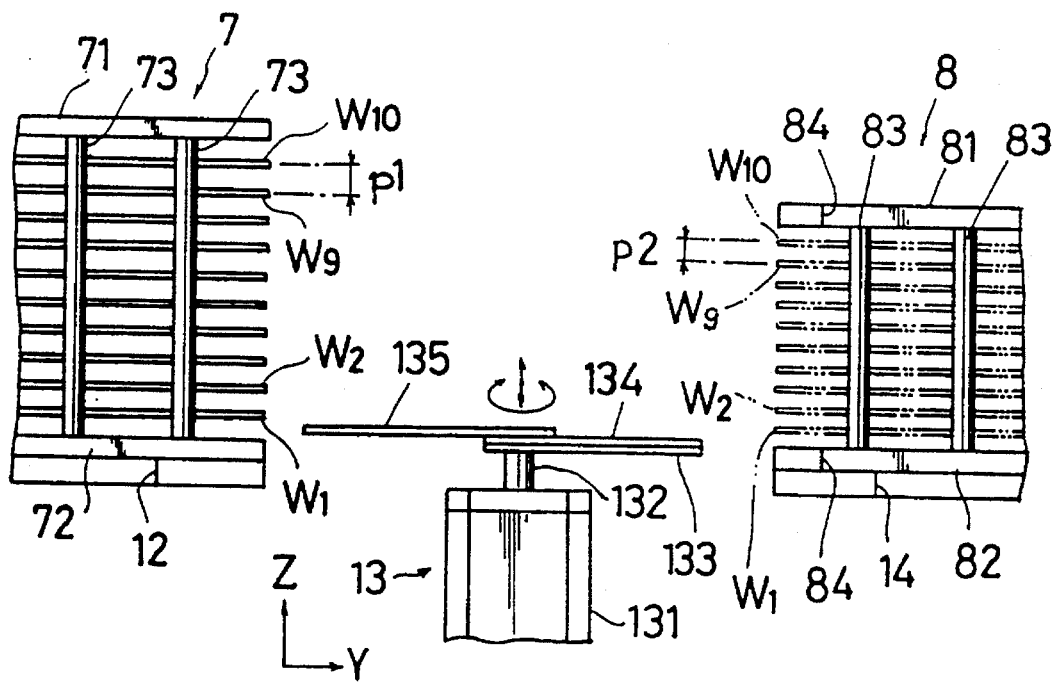
FIG. 7 is an explanatory diagram showing a substrate transfer sequence.

The loader station 1 will be described first with reference to FIGS. 1, 2 and 5 through 7. FIG. 5 is a view showing an outline of a portion of the apparatus including the loader and unloader stations. FIG. 6 is a view showing a substrate transfer robot of the loader station. FIG. 7 is an explanatory view showing a substrate transfer sequence.

The transport cassettes 7, each storing the plurality of substrates W arranged with storage spacing p1 therebetween, which are to be cleaned in this apparatus, are transported from the preceding stage of treatment to this apparatus by a transport device not shown. Each transport cassette 7 is introduced into the apparatus through an inlet 11 shown in FIGS. 1 and 2, and placed on a depository 12. The transport cassette 7 is placed on the depository 12 as turned over to rest on its side, with the substrates W lying in horizontal posture and the bottom of the cassette 7 facing the inlet 11. Thus, the substrates W may be withdrawn in horizontal posture from the transport cassette 7 on the depository 12, in a direction away from the inlet 11.

To maintain the highly clean atmosphere in the apparatus, the inlet 11 includes a shutter not shown, which is opened only when the transport cassettes 7 passes through the inlet 11, and remains closed at other times. The depository 12 is formed of two channel-shaped projections on a table 1a shown in FIG. 2. A slot 1b between the projections will be described hereinafter.

The inlet 11 corresponds to the transport cassette loader delivery section of the present invention. The depository 12 corresponds to the transport cassette loader transfer station of the present invention. The inlet 11 and an outlet 34 of the unloader station 3 described hereinafter correspond also to the transport cassette delivery section of the present invention. The depository 12 and a depository 33 of the unloader station 3 described hereafter correspond also to the transport cassette transfer station of the present invention.

A loader substrate transfer robot 13 is disposed opposite the inlet 11 across the depository 12. A depository 14 is disposed opposite the depository 12 across the loader substrate transfer robot 13. The depository 14 has a similar construction to the depository 12, and is formed on a table 1c in FIG. 2.

When each transport cassette 7 is introduced and placed on the depository 12, an empty processing cassette 8 is present on the depository 14, resting on its side with the upper end facing the depository 12, for receiving the substrates W in horizontal posture. Then, the loader substrate transfer robot 13 transfers the substrates W to be cleaned, from the transport cassette 7 on the depository 12 to the processing cassette 8 on the depository 14.

The loader substrate transfer robot 13 corresponds to the substrate transfer device of the present invention. The depository 14 corresponds to the processing cassette loader transfer station of the present invention. The loader substrate transfer robot 13 and an unloader substrate transfer robot 32 described hereinafter correspond also to the substrate transfer device of the present invention. The depository 14 and a depository 31 of the unloader station 3 described hereinafter correspond also to the processing cassette transfer station of the present invention.

The loader substrate transfer robot 13 (FIG. 6) includes a base 131 rotatably supporting a shaft 132 extendible and retractable in Z direction (vertical). A first arm 133 is pivotally attached at a proximal end thereof to an upper end of the shaft 132. A second arm 134 is pivotally attached at a proximal end thereof to a distal end of the first arm 133. A substrate carrier 135 is pivotally attached at a proximal end thereof to a distal end of the second arm 134. The substrate carrier 135 defines holes, not shown, for drawing a lower surface of each substrate W by suction. These holes are in communication with a vacuum pump, not shown, through pipes, not shown, mounted in the arms 134 and 133, shaft 132 and base 131. When the proximal end of the first arm 133 is turned in a predetermined direction (e.g. clockwise in direction Ha in FIG. 6), the proximal end of the second arm 134 is turned in an opposite direction (counterclockwise in direction Hb in FIG. 6). At this time, the proximal end of the substrate carrier 135 is turned in the direction opposite to the turning direction of the proximal end of the second arm 134 (i.e. clockwise in direction Hc in FIG. 6). In this way, the arms 133 and 134 are flexible to move the substrate carrier 135 into and out of the cassettes 7 and 8.

The shaft 132, arms 133 and 134 and substrate carrier 135 constitute the substrate withdrawing and inserting device of the present invention. The shaft 132 acts as the vertical displacement device of the present invention.

A sequence of transferring the substrates W will be described next with reference to FIG. 7.

First, the shaft 132 is extended or retracted to adjust the substrate carrier 135 to a level for insertion under a lowermost substrate W1 in the transport cassette 7. Next, the shaft 132 is rotated to direct a distal end of the substrate carrier 135 toward the transport cassette 7 as shown in FIGS. 2 and 5. The proximal ends of the first arm 133, second arm 134 and substrate carrier 135 are synchronously turned in the directions Ha, Hb and Hc, respectively, to extend the arms 133 and 134 from a contracted (folded) state, and to insert the substrate carrier 135 under the lowermost substrate W1 in the transport cassette 7. Next, the shaft 132 is slightly extended in Z direction to raise the substrate carrier 135 into contact with a lower surface of the substrate W1, whereupon the substrate W1 is sucked to the substrate carrier 135. In this state, the proximal ends of the first arm 133, second arm 134 and substrate carrier 135 are synchronously turned in the directions opposite to the above to contract the arms 133 and 134. As a result, the substrate carrier 135 suction-supporting the substrate W1 is withdrawn from the transport cassette 7, thereby taking the substrate W1 out of the transport cassette 7.

Next, the shaft 132 is rotated 180 degrees relative to the base 131 to direct the distal end of the substrate carrier 135 toward the processing cassette 8. Further, the shaft 132 is retracted in Z direction to adjust the substrate carrier 135 to a level for storing the substrate W1 in a lowermost position in the processing cassette 8. This level adjustment of the substrate carrier 135 is effected in order to absorb the difference between the storage spacing p1 of the transport cassette 7 and the storage spacing p2 of the processing cassette 8. Then, as above, the substrate carrier 135 suction-supporting the substrate W1 is inserted into the processing cassette 8 to store the substrate W1 in the lowermost position in the processing cassette 8. Next, the substrate W1 is released, the shaft 132 is slightly retracted in Z direction to move the substrate carrier 135 out of contact with the substrate W1, and the substrate carrier 135 is withdrawn from the processing cassette 8.

This completes the transfer of substrate W1, which is followed by transfer of substrate W2.

The shaft 132 is rotated 180 degrees relative to the base 131, and extended in Z direction to adjust the substrate carrier 135 to a level for insertion under a substrate W2 stored in the second lowest position in the transport cassette 7. Then, as described above, the substrate W2 is taken out of the transport cassette 7, and stored in the second lowest position in the processing cassette 8.

In this way, all of the substrates W1-W10 are transferred one after another from the transport cassette 7 to the processing cassette 8.

In the above sequence, the substrates W are transferred successively in the order from the lowermost substrate W1 to the uppermost substrate W10. Alternatively, the transfer may be carried in the reversed order from the uppermost substrate W10 to the lowermost substrate W1.

Upon completion of the transfer of substrates W, the empty transport cassette 7 is transported through the transport cassette buffer 5 to the depository 33 of the unloader station 3 as described hereinafter. The processing cassette 8 storing the plurality of substrates W to be cleaned is transported into the surface treating section 2 described hereinafter.

Next, the surface treating section 2 will be described with reference to FIGS. 2, 5, 8 and 9.

Figure 8:
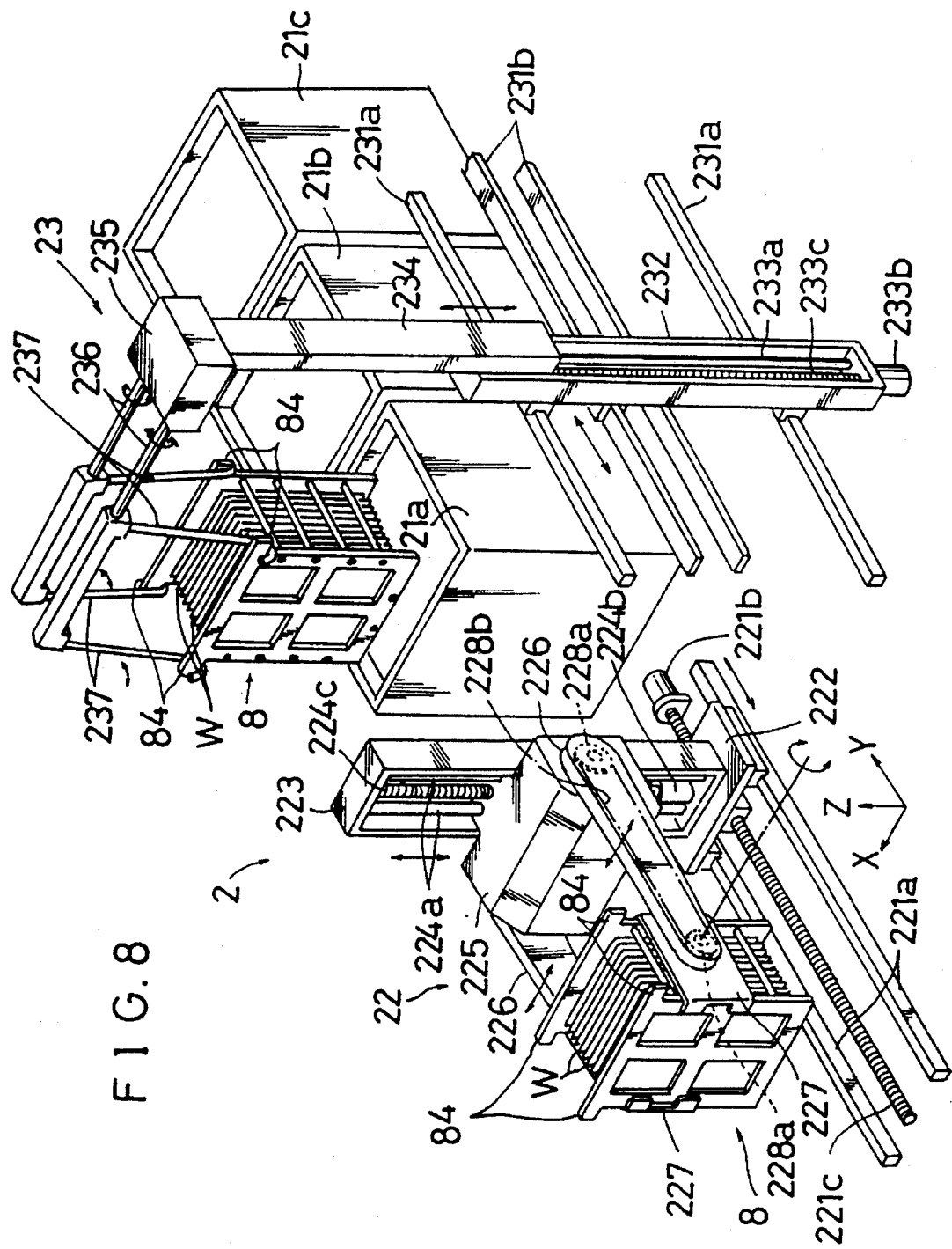
FIG. 8 is a perspective of a posture change robot, and a surface treatment robot for transporting the processing cassette in a horizontal or Y direction.
Figure 9:
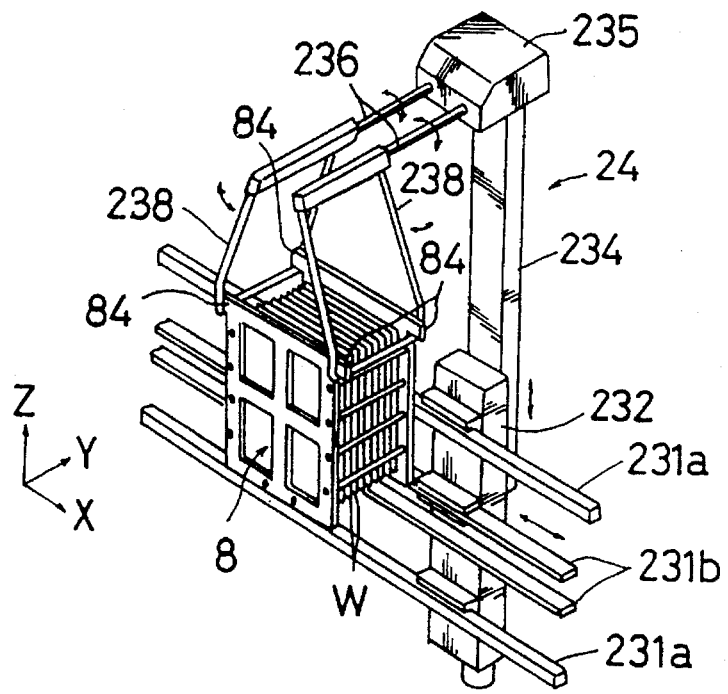
FIG. 9 is a perspective of a surface treatment robot for transporting the processing cassette in another horizontal or X direction.
Figure 10:
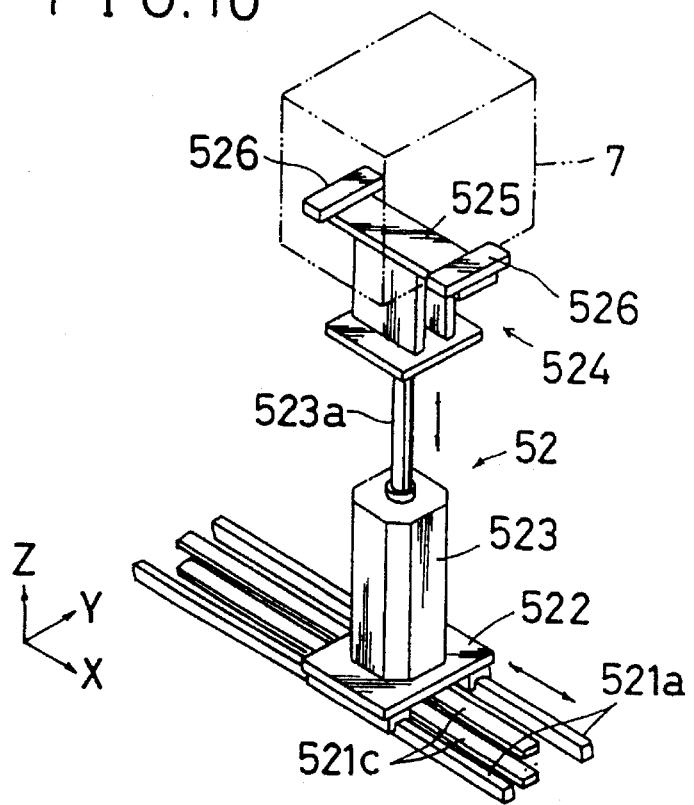
FIG. 10 is a perspective of a transport robot for transporting the transport cassette.

FIG. 8 is a view showing a posture change robot, and a surface treatment robot for transporting the processing cassette in Y direction. FIG. 9 is a view showing a surface treatment robot for transporting the processing cassette in X direction.

The surface treating section 2 includes a plurality of (seven in FIG. 2) treating baths 21a–21g arranged along a U-shaped transport path as shown in dot-and-dash lines in FIG. 2. In the treating baths 21a–21g, the plurality of substrates W stored in the processing cassette 8 are cleaned with varied cleaning liquids and dried. The surface treating section 2 further includes a posture change robot 22, surface treatment robots 23, 24 and 25, and a posture change robot 26. The posture change robot 22 stands upright the processing cassette 8 placed on the depository 14 of the loader station 1 as turned over to rest on its side. The surface treatment robots 23, 24 and 25 receive the upright processing cassette 8 from the posture change robot 22, and transport the processing cassette 8 along the transport path, inserting the processing cassette 8 into the treating baths 21a–21g to clean and dry the substrates W. The posture change robot 26 receives the upright processing cassette 8 from the surface treatment robot 25, turns over the processing cassette 8 to one side, and places the processing cassette 8 on the depository 31 of the unloader station 3.

The treating baths 21a–21g constitute the surface treating section of the present invention. The posture change robots 22 and 26 and surface treatment robots 23, 24 and 25 constitute the surface treatment transport device of the present invention.

The constructions of the posture change robots 22 and 26 and surface treatment robots 23, 24 and 25 will be described with reference to FIGS. 8 and 9.

The posture change robots 22 and 26 have the same constructions, so that for the sake of brevity only the construction of robot 23 will be described in detail, first with reference to FIG. 8.

The posture change robot 22 includes a lift 223 erected on a base 222 reciprocable in Y direction along rails 221a, driven by a screw shaft 221c rotatable by a motor 221b. The lift 223 supports a drive unit 225 vertically movable along guide rods 224a, driven by a screw shaft 221c rotatable by a motor 224b. Two support arms 226 are attached at proximal ends thereof to opposite sides of the drive unit 225 to be movable between an open position and a closed position. The support arms 226 support chuck elements 227 rotatably mounted on distal ends thereof, respectively, for holding the processing cassette 8 therebetween. The support arms 226 are opened and closed synchronously by extending and retracting rods of air cylinders, not shown, mounted in the drive unit 225. The chuck elements 227 are rotated by transmitting a reversible rotation of a motor, not shown, mounted in the drive unit 225, through pulleys 228a and belts 228b mounted in the respective support arms 226. The rails 221a and screw shaft 221c are laid for allowing the base 222 (i.e. the entire posture change robot 22) to move in Y direction between a position adjacent the depository 14 and a position adjacent the first treating bath 21a.

As for the posture change robot 26, rails 221a and screw shaft 221c are laid for allowing its movement between the last treating bath 21g and the depository 31 of the unloader station 3.

The surface treatment robots 23, 24 and 25 will be described next with reference to FIGS. 8 and 9. FIG. 8 shows the surface treatment robot 23. The surface treatment robot 25 has the same construction as the surface treatment robot 23.

The surface treatment robot 23, as shown in FIG. 8, includes a movable member 232 connected to a conveyor 231b driven by a motor, not shown, to be reciprocable in Y direction, guided by rails 231a. The movable member 232 supports a lift 234 vertically movable in Z direction along a guide rod 233a, by a screw shaft 233c rotatable by a motor 233b. A drive unit 235 is mounted on an upper end of the lift 234. Two rotary shafts 236 extend in X direction from the drive unit 235, and support openable and closable hooks 237 attached to distal ends thereof, respectively. The hooks 237 are opened and closed by synchronous rotation of the rotary shafts 236 driven by motors, not shown, mounted in the drive unit 235. The rails 231a and conveyor 231b are laid for allowing the movable member 232 (the entire surface treatment robot 23) to move between a position for receiving the processing cassette 8 held in upright posture by the posture change robot 22 adjacent the first treating bath 21a and a position (referenced PP1 in FIG. 2) for passing the processing cassette 8 on to the surface treatment robot 24 described hereinafter.

Referring to FIG. 9, the surface treatment robot 24 has the same construction as the surface treatment robot 23 excepting that rotary shafts 236 extending in Y direction support openable and closable hangers 238 in place of the hooks 237 of the surface treatment robot 23. The rails 231a and conveyor 231b are laid for allowing the surface treatment robot 24 to move between the position (PP1 in FIG. 2) for receiving the processing cassette 8 from the surface treatment robot 23 and a position (PP2 in FIG. 2) for passing the processing cassette 8 on to the surface treatment robot 25.

As note previously, the surface treatment robot 25 has the same construction as the surface treatment robot 23. The rails 231a and conveyor 231b are laid for allowing the surface treatment robot 25 to move between the position (PP2 in FIG. 2) for receiving the processing cassette 8 from the surface treatment robot 24 and a position adjacent the last treating bath 21g for passing the processing cassette 8 in upright posture on to the posture change robot 26.

Operations of the posture change robot 22, surface treatment robots 23, 24 and 25 and posture change robot 26 will be described next with reference to FIGS. 5, 8 and so on.

As shown in FIG. 5, the posture change robot 22 moves on the base 222 to an end region of the rails 221a and screw shaft 221c adjacent the depository 14, rotates the chuck elements 227 to hold the processing cassette 8 lying on its side, opens the support arms 226, and lowers the drive unit 225. The support arms 226 are closed, with the chuck elements 227 holding opposite sides of the processing cassette 8 resting on the depository 14. Next, the drive unit 225 is raised, picking up the processing cassette 8 from the depository 14. In this state, the chuck elements 227 are rotated 90 degrees to stand the processing cassette 8 upright with its upper end facing upward. The processing cassette 8 is raised above the depository 14 in order to avoid interference between the processing cassette 8 and depository 14 and the like when rotating the processing cassette 8. As shown in FIG. 8, the base 222 is moved to an end region of the rails 221a and screw shaft 221c adjacent the first treating bath 21a to pass the upright processing cassette 8 on to the surface treatment robot 23.

Next, the surface treatment robot 23 moves to an end region of the rails 231a and conveyor 231b opposed to the posture change robot 22, closes the hooks 237, and motor 233b lowers the lift 234 in Z direction to lower the hooks 237. Then, the hooks 237 are opened, and the lift 234 is raised in Z direction. The lift 234 is stopped, with the hooks 237 engaging the upper lugs 84 of the upright processing cassette 8 clamped by the posture change robot 22. Then, the posture change robot 22 opens the support arms 226 to release the processing cassette 8. Once the processing cassette 8 is released, the surface treatment robot 23 raises the lift 234 in Z direction to pick up the processing cassette 8 by means of the hooks 237. This completes the transfer of the processing cassette 8 from the posture change robot 22 to the surface treatment robot 23. After the transfer of the processing cassette 8, the posture change robot 22 moves toward the depository 14 to turn over the next processing cassette 8. On the other hand, the surface treatment robot 23 moves the movable member 232 toward the treating bath 21a, and stops when the processing cassette 8 reaches a position over the treating bath 21a. Then, the lift 234 is lowered in Z direction to deliver the processing cassette 8 into the treating bath 21a.

The treating bath 21a contains a predetermined cleaning solution. The plurality of substrates W stored in the processing cassette 8 are immersed, along with the processing cassette 8, in the cleaning solution to be cleaned in the overflow mode. If the spacing between the substrates W were too small, the cleaning solution would not flow smoothly through spaces between the substrates W, thereby lowering the cleaning effect. If the spacing between the substrates W were too large, the treating bath 21a would need a large capacity, thereby enlarging the entire apparatus, and consuming a large quantity of cleaning solution to entail high running cost. In this embodiment, however, each processing cassette 8 provides minimum spacing (optimal spacing) p2 between the substrates W, within a range not impairing the cleaning effect. This allows the treating bath 21a to have a small capacity, thereby realizing compactness of the apparatus without lowering the cleaning effect. This feature also achieves a reduced consumption of cleaning solution to cut down running cost. This applies to the other treating baths 21b–21g as well.

The processing cassette 8 remains immersed in the treating bath 21a for a predetermined time. Upon completion of the cleaning in the treating bath 21a, the surface treatment robot 23 withdraws the processing cassette 8 from the treating bath 21a. Then, the movable member 232 is moved toward the treating bath 21b, and is stopped when the processing cassette 8 reaches a position over the treating bath 21b. The lift 234 is lowered in Z direction to place the processing cassette 8 in the treating bath 21b to clean the substrates W. After this cleaning step, the substrates W are cleaned in the treating bath 21c as above. Subsequently, the processing cassette 8 is transported to the transfer position PP1 (FIG. 2) and placed on a table 2a. The surface treatment robot 23 lowers the lift 234 in Z direction, closes the hooks 237, and raises the lift 234 in Z direction. The hooks 237 become disengaged from the upper lugs 84 of the processing cassette 8. Then, the surface treatment robot 23 retracts from the transfer position PP1 to handle the next processing cassette 8.

Next, the surface treatment robot 24 moves to the transfer position PP1, opens the hangers 238, and lowers the lift 234. Then, the robot 24 closes the hangers 238 to engage the upper lugs 84 of the processing cassette 8 placed on the table 2a in the transfer position PP1, and raises the lift 234 in Z direction to pick up the processing cassette 8. The robot 24 transports the processing cassette 8 to the next transfer position PP2 (FIG. 2), disengages the hangers 228, and deposits the processing cassette 8.

Next, the surface treatment robot 25 engages the hooks 37 with the upper lugs 84 of the processing cassette 8 that has been placed on the table 2a in the transfer position PP2 to pick up the processing cassette 8. The substrates W then receive cleaning treatment successively in the treating baths 21d–21f, and are dried in the treating bath 21g. The upright processing cassette 8 is transferred to the posture change robot 26 standing by adjacent the treating bath 21g. The processing cassette 8 is transferred in a sequence reversed from the transfer thereof from the posture change robot 22 to the surface treatment robot 23. The posture change robot 26, having received the processing cassette 8 storing the cleaned substrates W, turns over the processing cassette 8 from the upright posture to a sideways posture, transports the processing cassette 8 to the depository 31 of the unloader station 3, and places the processing cassette 8 in the sideways posture on the depository 31.

The transport path of processing cassettes 8 turned back in U shape realizes an improved area use efficiency, as distinct from the prior apparatus having treating baths arranged linearly in succession. This transport path also allows the piping/maintenance areas 4 to be disposed centrally of the apparatus, whereby the apparatus may be designed compact. Further, since the loader station 1 and the unloader station 3 described hereinafter are arranged close to each other, the transport cassette buffer 5 and processing cassette buffer 6 described hereinafter may be provided without enlarging the apparatus.

The construction of the unloader station 3 will be described next with reference to FIGS. 2 and 5.

The unloader station 3 includes the depository 31 for supporting a processing cassette 8 placed sideways, the unloader posture change robot 32, the depository 33 for supporting an empty transport cassette 7 placed sideways, and the outlet 34 for permitting transport cassettes 7 to be transported out of the apparatus. The depository 31, unloader posture change robot 32, depository 33 and outlet 34 have the same constructions as the depository 14, loader posture change robot 13, depository 12 and inlet 11, respectively, of the loader station 1, so that for the sake of brevity, their construction details shall not be repeated.

The operation of the unloader station 3 will be described next.

The posture change robot 26 of the surface treating section 2 places the processing cassette 8 storing the cleaned substrates W, on the depository 31. In the unloader station 3, the unloader posture change robot 32 transfers these substrates W to an empty transport cassette 7. After substrates W were unloaded from transport cassette 7 at loader station 1, the empty transport cassette 7 was transported through the transport cassette buffer 5 to depository 33 adjacent outlet 34. The cleaned substrates W are withdrawn from the processing cassette 8 in which the substrates W are arranged with storage spacing p2, and stored in the transport cassette 7 in which the substrates W are arranged with storage spacing p1. This difference in storage spacing is absorbed, as in the transfer operation in the loader station 1, by a level adjustment of the substrate carrier 135 between withdrawal of the substrates W from the processing cassette 8 and insertion thereof into the transport cassette 7.

Upon completion of the substrate transfer, the empty processing cassette 8 is transported through the processing cassette buffer 6 to the depository 14 of the loader station 1.

The transport cassette 7 storing the plurality of cleaned substrates W is transported by a transport device, not shown, out of the apparatus through the outlet 34 to the next stage of treatment. As does the inlet 11 in the loader station 1, the outlet 34 includes a shutter (not shown). The shutter is opened only when the transport cassettes 7 is transported out of the apparatus, in order to maintain the highly clean atmosphere in the apparatus.

As described above, the apparatus includes the loader station 1 and unloader station 3 for carrying out separate and independent operations to introduce a transport cassette 7 into the apparatus, transfer substrates W from the transport cassette 7 to a processing cassette 8, transfer the substrates W from the processing cassette 8 to a transport cassette 7, and remove the transport cassette 7 from the apparatus. It is possible, as in the seventh embodiment described hereinafter, to carry out operations simultaneously to transfer substrates W from a transport cassette 7 to a processing cassette 8, and to transfer substrates W from a processing cassette 8 to a transport cassette 7. Such an apparatus involves no waiting time in transferring substrates W.

The depository 31 of the unloader station 3 corresponds to the processing cassette unloader transfer station of the present invention, the unloader substrate posture change robot 32 to the unloader substrate transfer device, the depository 33 to the transport cassette unloader transfer station, and the outlet 34 to the transport cassette unloader delivery section.

The construction of the piping/maintenance areas 4 will be described next with reference to FIGS. 1, 2 and 5.

The piping/maintenance areas 4 include piping for supplying cleaning solutions to the treating bath 21 and the like in the surface treating section 2, and piping for exhausting the solutions after use in the cleaning treatment, and allow operators to carry out maintenance. As shown in FIG. 2, these areas are provided centrally of the surface treating section 2, and between the loader station 1 and unloader station 3. The piping/maintenance areas 4 are accessible through a passage 41 shown in FIG. 1. In the prior art, sideways elongated apparatus having treating baths arranged linearly in succession, piping/maintenance areas must be arranged longitudinally of the apparatus. With such large piping/maintenance areas, the apparatus requires a large installation space. However, in the embodiment of this invention hereinbefore described the transport path in the surface treating section 2 is turned back in U shape for allowing the piping/maintenance areas 4 to be arranged centrally of the apparatus. The small piping/maintenance areas 4 contribute toward compactness of the apparatus.

The construction of the transport cassette buffer 5 will be described next with particular reference to FIGS. 1, 2, 5 and 10. The latter is a perspective showing a transport robot for transporting the transport cassettes.

The transport cassette buffer 5 includes seven depositories 51 for supporting transport cassettes 7, which are arranged in series between the depository 12 of the loader station 1 and the depository 33 of the unloader station 3. Each of these depositories 51 has the same construction as the depository 12, and is provided on the table 1a shown in FIG. 2. The slot 1b extends through middle positions of the depositories 12, 51 and 33. A transport cassette transport robot 52 (FIGS. 5 and 10) is provided below the table 1a for transporting transport cassettes 7 from the depository 12 through depositories 51 to depository 33.

The transport robot 52 includes a base 522 connected to a conveyor 521c driven by a motor 521b to be reciprocable in X direction, guided by rails 521a, and an air cylinder 523 mounted on the base 522. A cassette carrier 524 is attached to a distal end of a rod 523a of the air cylinder 523 to be vertically movable in Z direction with extension and contraction of the rod 523a. The cassette carrier 524 includes a cassette support 525 for supporting the bottom of each transport cassette 7, and side supports 526 for supporting opposite sides of the transport cassette 7. When the rod 523a of the air cylinder 523 is contracted, the cassette support 524 is retracted below the table 1a. When the rod 523a is extended, the cassette support 524 is projected above the table 1a through the slot 1b. For transporting each transport cassette 7, the rod 523a is extended to move the cassette support 524 into contact with the bottom of the transport cassette 7 and raise the cassette 7 above the depository 12. The base 522 is moved in X direction to transport the transport cassette 7 to a position over a predetermined one of the depositories 51 and 33. Then, the rod 523a is contracted to place the transport cassette 7 on the depository 51 or 33. During this operation, the rod 523a moves along the slot 1b, free of interference with the table 1a.

The operation of the transport cassette buffer 5 will be described next.

After substrates W are transferred from a transport cassette 7 placed on the depository 12 in the loader station 1 to a processing cassette 8 placed on the depository 14, the transport cassette transport robot 52 raises the cassette support 524 from below the depository 12 to pick up the empty transport cassette 7 above the depository 12. Then, the transport robot 52 moves in X direction to transport the transport cassette 7 toward the depository 33 in the unloader station 3. The transport robot 52 places the transport cassette 7 on a predetermined one of the depositories 51 and 33 not occupied by a different transport cassette 7. If no transport cassette 7 is present on the depository 33, the transport robot 52 places the empty transport cassette 7 it is transporting on the depository 33. If a transport cassette 7 is found on the depository 33, the transport robot 52 places the empty transport cassette 7 on a free depository 51 for standby. At this time, the depositories 51 are used to store transport empty cassettes 7 that are to be moved to the depository 33 for standby. While transport cassettes 7 are standing by on the depositories 51, the transport cassette 7 that is carrying cleaned substrates W and is on the depository 33, may be removed therefrom. In this case, the transport robot 52 feeds the transport cassettes 7 on the depositories 51 toward the depository 33. Consequently, the transport cassettes 7 standing by on the depositories 51 are successively moved to the depositories 51 closer to the depository 33, and to the depository 33 from the depository 51 adjacent thereto. To check use conditions of the depositories 33 and 51, sensors (not shown) are provided to detect transport cassettes 7 placed on the depositories 33 and 51.

Thus, the depositories 51 allow empty transport cassettes 7 to stand by when a difference occurs between a period of time from introduction of transport cassette 7 into the apparatus to placement thereof on the depository 33 and a period of time required for the cleaning treatment in the surface treating section 2. Further, an empty transport cassette 7 may be maintained on the depository 33 when a processing cassette 8 having completed the cleaning treatment in the surface treating section 2 is placed on the depository 31 in the unloader station 3. This allows transfer of cleaned substrates W to be carried out without requiring the processing cassette 8 to stand idle on the depository 31 in the unloader station 3. In addition, since the incoming transport cassettes 7 are used as outgoing transport cassettes 7, the inlet 11 may be used exclusively for entry of the transport cassettes 7 and the outlet 34 exclusively for exit of the transport cassettes 7. This embodiment provides seven depositories 51, but the number of depositories 51 is not limited to seven.

The depositories 51 correspond to the transport cassette buffer of the present invention. The transport cassette transport robot 52 corresponds to the transport cassette transport device of the present invention.

The construction of the processing cassette buffer 6 will be described next with reference to FIGS. 1, 2 and 5.

As does the transport cassette buffer 5, the processing cassette buffer 6 includes seven depositories 61 for supporting processing cassettes 8, which are arranged in series on the table 1c between the depository 14 of the loader station 1 and the depository 31 of the unloader station 3. A processing cassette transport robot 62 is provided below the table 1c for transporting processing cassettes 8 from the depository 31 through depositories 61 to depository 14. The depositories 61 and processing cassette transport robot 62 have the same constructions as the depositories 51 and transport cassette transport robot 52 of the transport cassette buffer 5, respectively, and will not particularly be described here. A slot 1d extending through middle positions of the depositories 14, 61 and 31 corresponds to the slot 1b described hereinbefore, and provides a passage for movement in X direction of the processing cassette transport robot 62. The depositories 61 correspond to the processing cassette buffer of the present invention. The processing cassette transport robot 62 corresponds to the processing cassette transport device of the present invention.

The operation of the processing cassette buffer 6 will be described next.

After substrates W are transferred from a processing cassette 8 placed on the depository 31 in the unloader station 3 to a transport cassette 7 placed on the depository 33, the processing cassette transport robot 62 transports the empty processing cassette 8 toward the depository 14 in the loader station 1. The transport robot 62 places the processing cassette 8 on a predetermined one of the depositories 14 and 61 not occupied by a different processing cassette 8. In the processing cassette buffer 6, as in the transport cassette buffer 5, the processing cassettes 8 are placed on the depositories 61 as compacted toward the depository 14 for standby, according to use conditions of the depositories 14 and 61. When a processing cassette 8 is transported from the depository 14 to the surface treating section 2, making the depository 14 free for use, the processing cassette transport robot 62 feeds the processing cassettes 8 on the depositories 61 toward the depository 14.

Thus, the depositories 61 maintain empty processing cassettes 8 in standby to allow an empty processing cassette 8 to be present on the depository 14 when a transport cassette 7 is introduced into this apparatus and placed on the depository 12. This enables the transfer of substrates W pending the cleaning treatment to be carried out without requiring the transport cassette 7 to stand idle on the depository 12 in the loader station 1. Further, each processing cassette 8 is used cyclically in the apparatus, without departing from the apparatus. Consequently, the processing cassettes 8 has no possibility of becoming contaminated outside the apparatus, and thus the substrates W have little likelihood of being contaminated by the processing cassettes 8. This embodiment provides seven depositories 61, but the number of depositories 61 is not limited to seven.

The processing cassette buffer 6 and transport cassette buffer 5 allow the apparatus to carry out a series of steps smoothly, to introduce a transport cassette 7 into the apparatus, transfer substrates W to be cleaned, clean the substrates W in the surface treating section 2, transfer the cleaned substrates W to a transport cassette 7, and transport the transport cassette 7 out of the apparatus.

In the foregoing embodiment, each transport cassette 7 provides a larger storage spacing than the optimal storage spacing for cleaning treatment. This embodiment is equally applicable where each transport cassette 7 provides a smaller storage spacing than the optimal storage spacing for cleaning treatment. The effect of cleaning treatment would be lowered if each transport cassette 7 provided a smaller spacing than the optimal storage spacing for cleaning treatment, and substrates W received the cleaning treatment after being transferred to a processing cassette 8 providing the same storage spacing as the transport cassette 7, instead of the optimal storage spacing. This embodiment is free from such an inconvenience.

Figure 11:
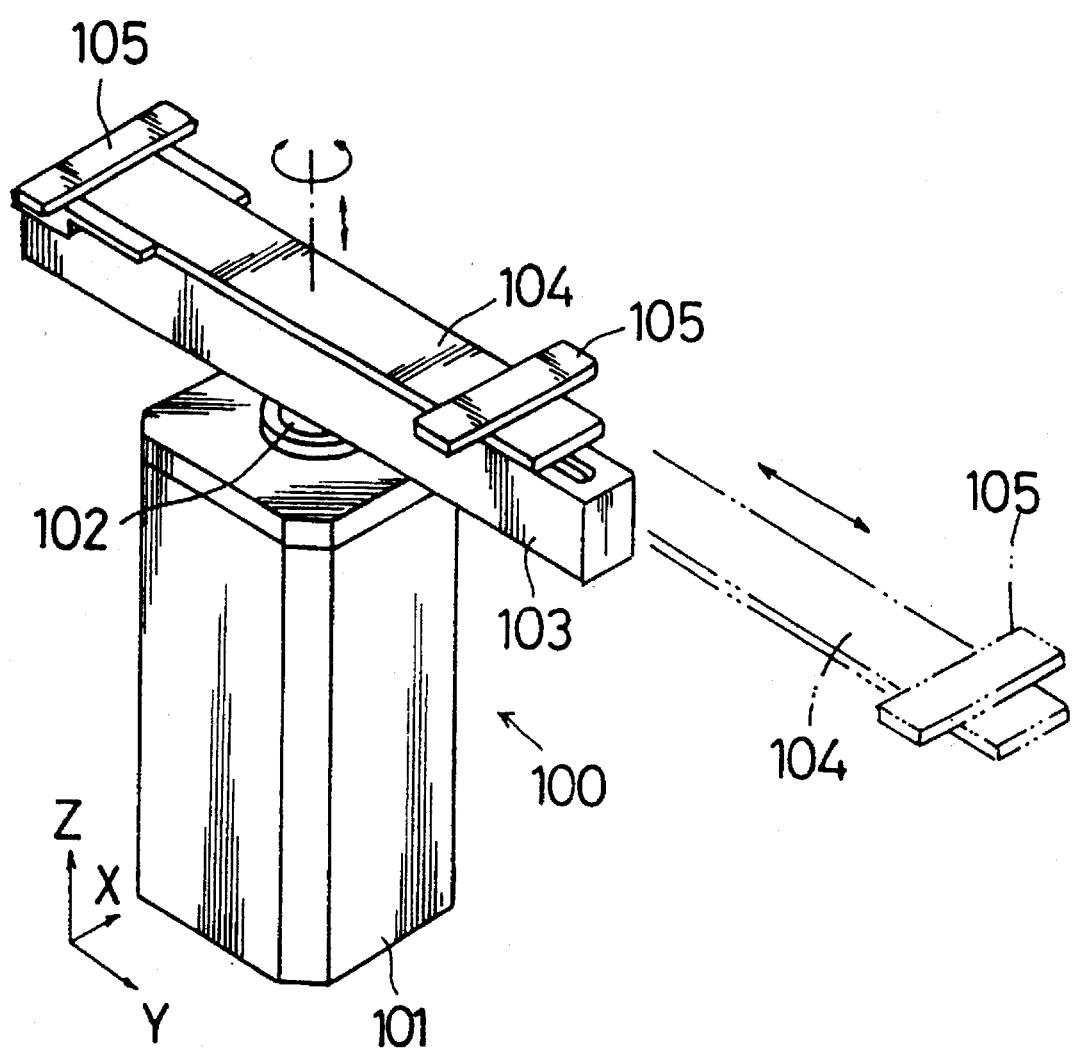
FIG. 11 is a perspective of a modified substrate transfer robot.

In the foregoing and subsequent embodiments, the loader substrate transfer robot 13 and unloader substrate transfer robot 32 comprise articulated type robots as shown in FIG. 6. FIG. 11 shows a robot 100 as an alternative example to be employed as each of these substrate transfer robots 13 and 32.

This robot 100 includes a base 101, and a rotary shaft 102 mounted in the base 101 to be vertically movable in Z direction. The rotary shaft 102 has an arm support 103 attached to a distal end thereof. The arm support 103 supports an arm 104 to be extendible and retractable relative thereto. The arm 104 has holders 105 arranged at a distal end and a proximal end thereof for drawing each substrate W by suction. This robot 100 moves substrates W into and out of the cassettes 7 and 8 by extension and retraction of the arm 104 and suction to the holders 105. A level adjustment for moving the substrates W into and out of the cassettes 7 and 8 is effected by vertical movement of the rotary shaft 102. Thus, the vertically movable rotary shaft 102, arm support 103, arm 104 and holders 105 of this robot 100 constitute the substrate withdrawing and inserting device of the present invention. The vertically movable rotary shaft 102 acts as the vertical displacement device of the present invention.

Second Embodiment

Figure 12:
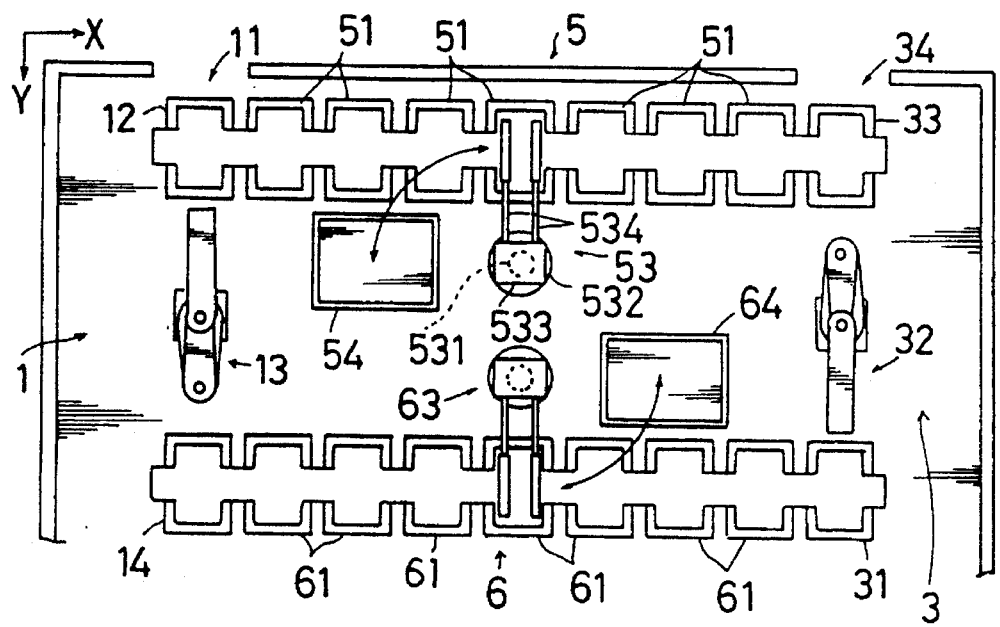
FIG. 12 is a plan view showing a portion of an apparatus according to a second embodiment, including a loader station and an unloader station.
Figure 13:
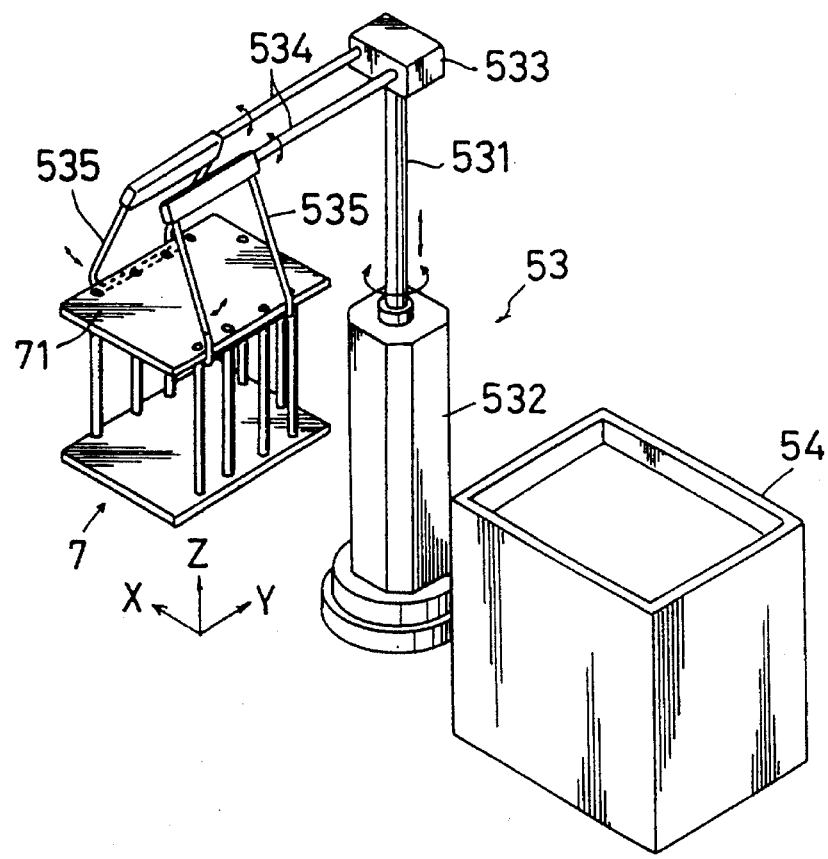
FIG. 13 is a perspective of a cleaning robot.

An apparatus in the second embodiment of the present invention will be described next with reference to FIG. 12 showing a loader station and an unloader station, and FIG. 13 showing a cleaning robot.

The apparatus in the second embodiment (FIG. 12) also includes a mechanism for cleaning empty transport cassettes 7, and a mechanism for cleaning empty processing cassettes 8. These mechanisms are disposed in the transport cassette buffer 5 and processing cassette buffer 6 of the apparatus in the first embodiment, respectively. The other aspects of the second embodiment are the same as in the first embodiment, and will not be described again.

The mechanism disposed in the transport cassette buffer 5 for cleaning empty transport cassettes 7 includes a cleaning robot 53 disposed laterally of the intermediate depositories 51, and a cleaning bath 54 for cleaning transport cassettes 7. The cleaning robot 53 and cleaning bath 54 correspond to the transport cassette cleaning section of the present invention.

The cleaning robot 53 (FIG. 13) includes a rotary shaft 531 attached to a base 532 to be vertically movable in Z direction. A drive unit 533 is mounted on an upper end of the rotary shaft 531. Rotary shafts 534 extend from the drive unit 533 and support openable and closable hangers 535. The hangers 535 are opened and closed by opposite rotations of the rotary shafts 534 driven by reversible rotation of a motor, not shown, mounted in the drive unit 533.

In this embodiment, the transport cassette transport robot 52 transports an empty transport cassette 7, having disposed of substrates W in the loader station 1, to an intermediate depository 51. Next, the cleaning robot 53 opens the hangers 536 in a position over the transport cassette 7 placed on the depository 51, lowers the rotary shaft 531 in Z direction to lower the hangers 535, and closes the hangers 535 to grip lateral edges of the upper plate 71 of the transport cassette 7. Then, the cleaning robot 53 extends the rotary shaft 531 upward to pick up the transport cassette 7. Next, the cleaning robot 53 rotates the rotary shaft 531 90 degrees to move the transport cassette 7 to a position over the cleaning bath 54, lowers the rotary shaft 531 in Z direction to place the transport cassette 7 in the cleaning bath 54 for cleaning the transport cassette 7. Upon completion of the cleaning, the transport cassette 7 is moved out of the cleaning bath 54. The cleaning robot 53 places the cleaned empty transport cassette 7 back on the same depository 51 in a sequence reversed from the above. Subsequently, as in the first embodiment, the transport cassette transport robot 52 transports the cleaned empty transport cassette 7 to a predetermined depository 34 or 51.

Thus, cleaned substrates W are transferred in the unloader station 3 to an empty transport cassette 7 cleaned in the transport cassette buffer 5. This alleviates the inconvenience of the cleaned substrates W becoming contaminated by impurities adhering to the transport cassette 7. Particularly in the cleaning apparatus as in this embodiment, recontamination of the cleaned substrates W is avoided.

The mechanism disposed in the processing cassette buffer 6 for cleaning empty processing cassettes 8 includes a cleaning robot 63 disposed laterally of the intermediate depositories 61 and having the same construction as the cleaning robot 53, and a cleaning bath 64 for cleaning processing cassettes 8. The processing cassettes 8 are cleaned in the same sequence as for cleaning the transport cassettes 7. The cleaning robot 63 and cleaning bath 64 correspond to the processing cassette cleaning section of the present invention.

Thus, substrates W to be cleaned are transferred in the loader station 1 to an empty processing cassette 8 cleaned in the processing cassette buffer 6. This alleviates the inconvenience of the substrates W becoming contaminated by impurities adhering to the processing cassette 8 prior to the cleaning treatment.

Third Embodiment

Figure 14:
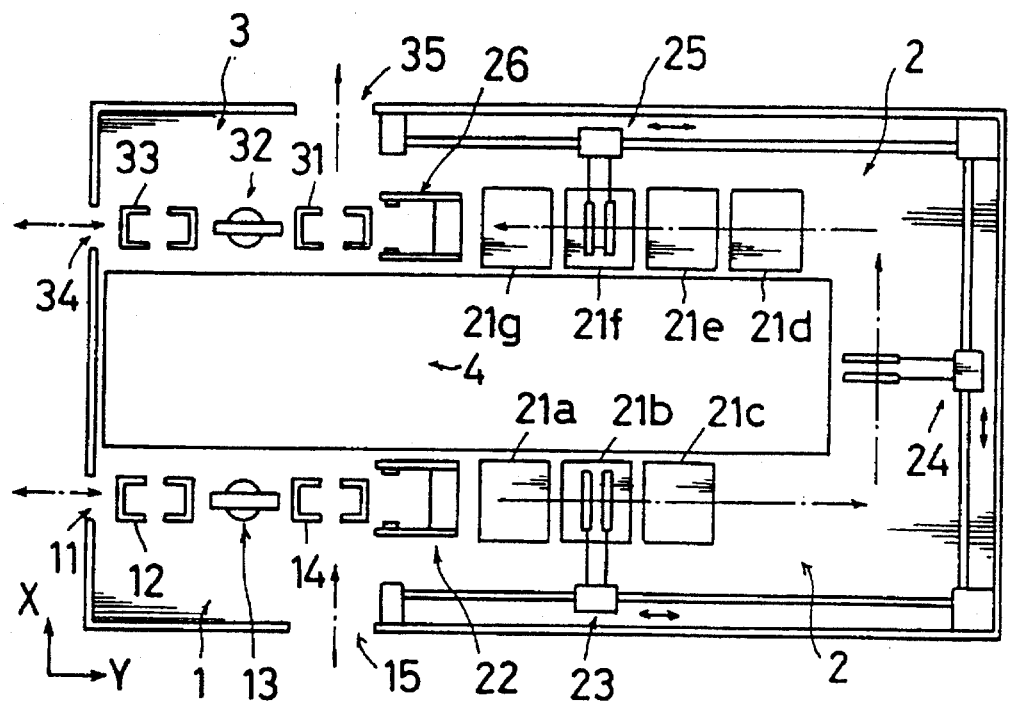
FIG. 14 is a plan view of an apparatus according to a third embodiment.

An apparatus according to the third embodiment of the present invention (FIG. 14) differs from the first embodiment in that the transport cassette buffer 5 and processing cassette buffer 6 are excluded from the apparatus. The other aspects of the third embodiment are the same as in the first embodiment, and will not be described again.

In the third embodiment, a transport cassette 7 storing substrates W to be cleaned is introduced into the loader station 1 through the inlet 11. After passing the substrates W on to a processing cassette 8, the empty transport cassette 7 is transported out of the apparatus through the inlet 11. An empty processing cassette 8 is transported to the depository 14 of the loader station 1 through an inlet 15 similar to the inlet 11.

As for the unloader station 3, an empty transport cassette 7 is introduced through the outlet 34. After cleaned substrates W are transferred from a processing cassette 8 to the empty transport cassette 7, the latter is transported out of the apparatus through the outlet 34. The empty processing cassette 8, after passing the cleaned substrates W on to the transport cassette 7, is transported out of the apparatus through an outlet 35 similar to the outlet 34.

The above construction produces the same effects as the first embodiment, except those derived from the transport cassette buffer 5 and processing cassette buffer 6. That is, the third embodiment also fulfills the primary object of the present invention to provide the surface treatment of a plurality of substrates W arranged with the optimal spacing in each processing cassette 8 without being governed by the storage spacing in the transport cassette 7. In this embodiment also, the transport path of processing cassettes 8 is turned back in U shape to achieve compactness of the apparatus. The loader station 1 and unloader station 3 are provided to enable independent operations to transfer substrates W from transport cassette 7 to processing cassette 8 and from processing cassette 8 to transport cassette 7. This allows substrates W to be transferred from processing cassette 8 to transport cassette 7 without waiting for completion of the substrate transfer from transport cassette 7 to processing cassette 8.

In this embodiment, the transport cassettes 7 used in the loader station 1 and the transport cassettes 7 used in the unloader station 3 may have different constructions. Thus, the transport cassettes 7 used in the loader station 1 may provide one storage spacing (e.g. p1), and the transport cassettes 7 used in the unloader station 3 another storage spacing (e.g. p3). The transport cassettes 7 of varied storage spacings may be selectively used according to a surface treating apparatus upstream of this apparatus and one downstream thereof.

The apparatus in the first embodiment described hereinbefore includes the transport cassette buffer 5 and processing cassette buffer 6. However, only one of the buffers may be provided. Where only the transport cassette buffer 5 is provided, empty processing cassettes 8 may be transported into and out of the apparatus as in the third embodiment. Where only the processing cassette buffer 6 is provided, transport cassettes 7 may be transported into and out of the apparatus as in the third embodiment.

The apparatus in the second embodiment includes the transport cassette buffer 5 with the mechanism for cleaning empty transport cassettes 7, and the processing cassette buffer 6 with the mechanism for cleaning empty processing cassettes 8. However, only the transport cassette buffer 5 with the mechanism for cleaning empty transport cassettes 7 may be provided, or only the processing cassette buffer 6 with the mechanism for cleaning empty processing cassettes 8 may be provided.

Fourth Embodiment

Figure 15:
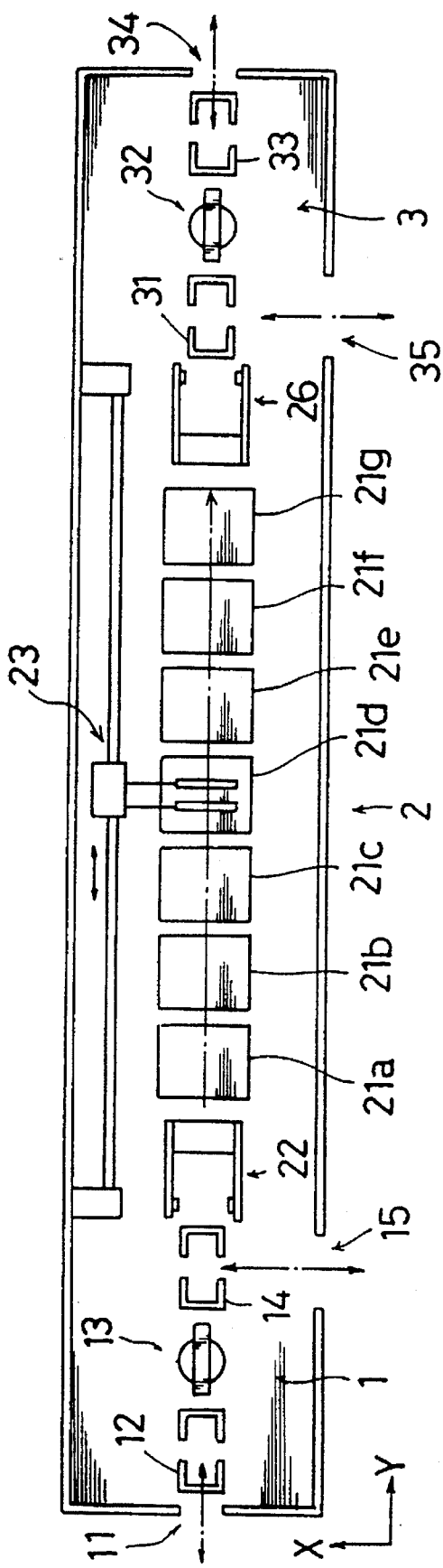
FIG. 15 is a plan view of an apparatus according to a fourth embodiment.

An apparatus according to the fourth embodiment of the present invention (FIG. 15) differs from the third embodiment in that the surface treating section 2 has a transport path extending linearly instead of being turned back in U shape. The treating baths 21a–21g and surface treatment robot 22 and the like are arranged along the linear path. In FIG. 15, like reference numerals are used to identify like parts in the third embodiment, and will not be described again.

The above construction produces the same effects as the third embodiment (including the primary object of the present invention), except those derived from the transport path turned back in U shape in the surface treating section 2.

Fifth Embodiment

Figure 16:
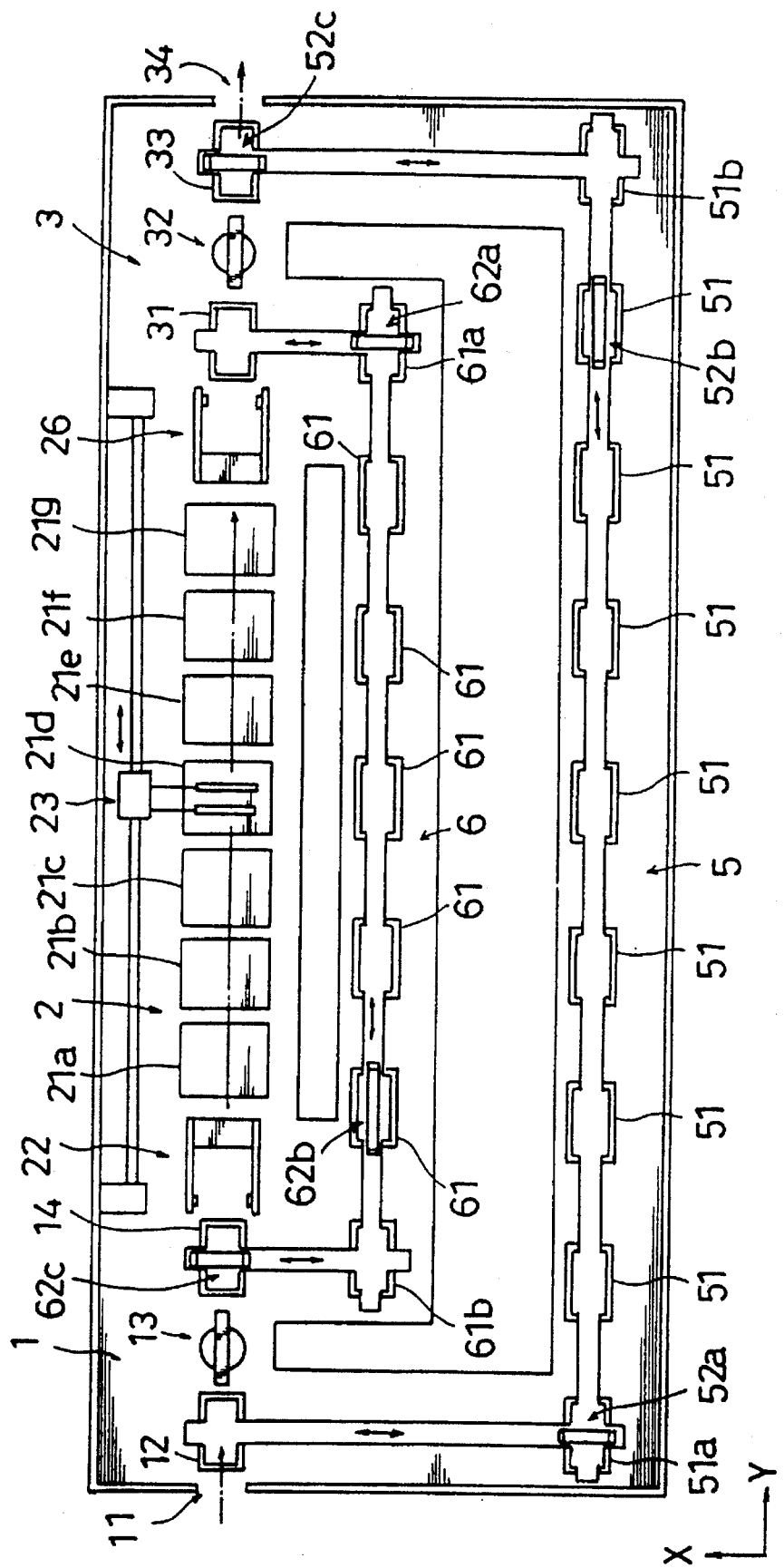
FIG. 16 is a plan view of an apparatus according to a fifth embodiment.

An apparatus according to the fifth embodiment of the present invention (FIG. 16) corresponds to the apparatus in the fourth embodiment with a transport cassette buffer 5 and a processing cassette buffer 6 added thereto. In FIG. 16, like reference numerals are used to identify like parts in FIGS. 2 and 15, which are the same as in the first and fourth embodiments, and will not be described again.

In the fifth embodiment, the transport cassette buffer 5 and processing cassette buffer 6 are U-shaped by reason of the construction of the apparatus. In the transport cassette buffer 5, a first transport cassette transport robot 52a (having the same construction as the transport cassette transport robot 52 shown in FIG. 10; and so do other robots 52b, 52c, 62a, 62b and 62c) transports an empty transport cassette 7 from a depository 12 to a depository 51a. A second transport cassette transport robot 52b transports the empty transport cassette 7 from the depository 51a through depositories 51 to a depository 51b. A third transport cassette transport robot 52c transports the empty transport cassette 7 from the depository 52b to a depository 33.

In the processing cassette buffer 6, a first processing cassette transport robot 62a transports an empty processing cassette 8 from a depository 31 to a depository 61a. A second processing cassette transport robot 62b transports the empty processing cassette 8 from the depository 61a through depositories 61 to a depository 61b. A third processing cassette transport robot 62c transports the empty processing cassette 8 from the depository 62b to a depository 14.

The above construction produces the same effects as the first embodiment (including the primary object of the present invention), except those derived from the transport path turned back in U shape in the surface treating section 2.

The fifth embodiment may be modified to include only one of the transport cassette buffer 5 and processing cassette buffer 6.

Sixth Embodiment

Figure 17:
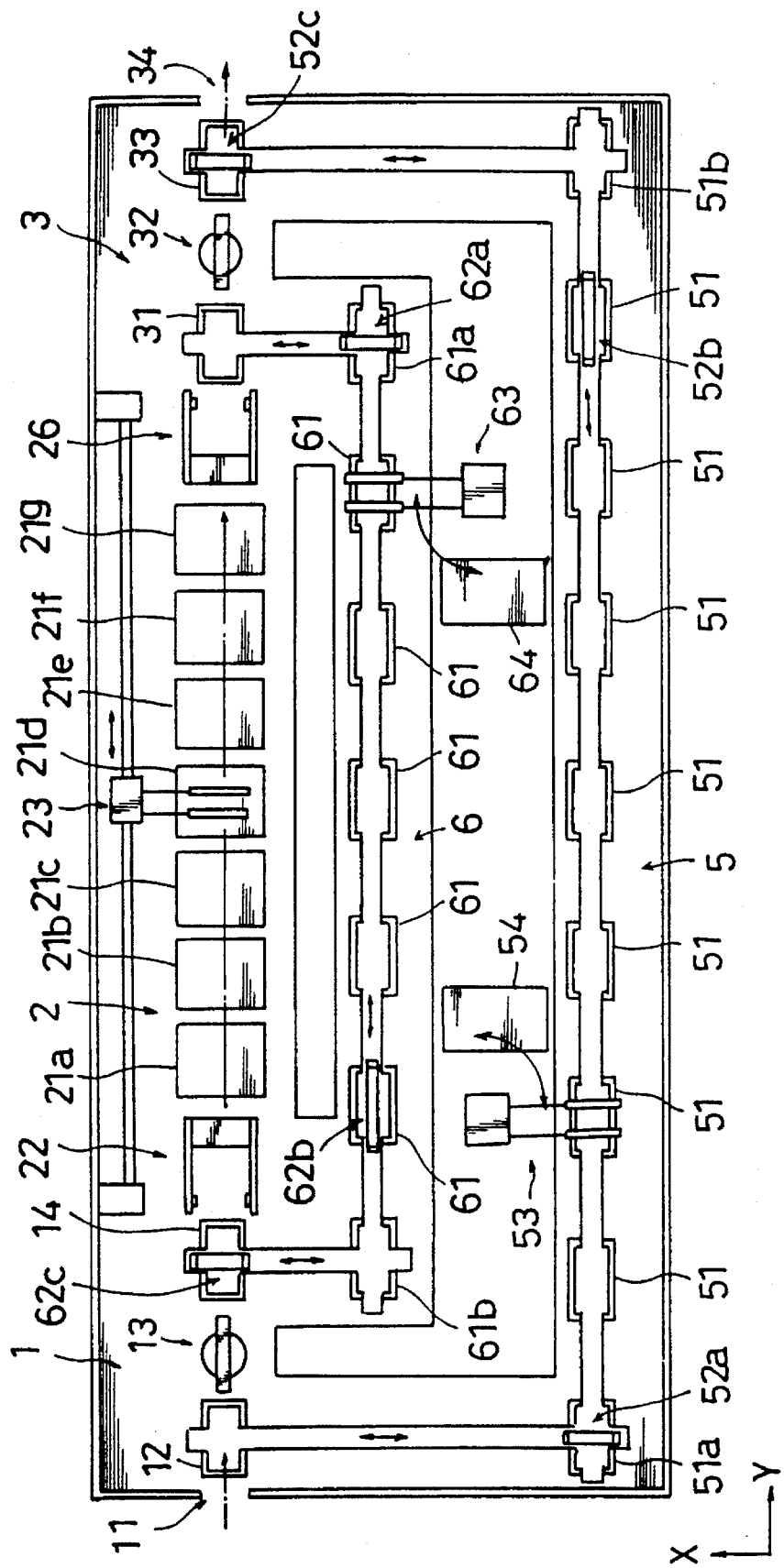
FIG. 17 is a plan view of an apparatus according to a sixth embodiment.

An apparatus according to the sixth embodiment of the present invention (FIG. 17) corresponds to the apparatus in the fifth embodiment additionally including a mechanism for cleaning empty transport cassettes 7, and a mechanism for cleaning empty processing cassettes 8. In FIG. 17, like reference numerals are used to identify like parts in FIGS. 2, 12 and 16, which are the same as in the second and fifth embodiments, and will not be described again.

The above construction produces the same effects as the second embodiment (including the primary object of the present invention), except those derived from the transport path turned back in U shape in the surface treating section 2.

In the sixth embodiment also, only the transport cassette buffer 5 with the mechanism for cleaning empty transport cassettes 7 may be provided, or only the processing cassette buffer 6 with the mechanism for cleaning empty processing cassettes 8 may be provided.

Seventh Embodiment

Figure 18:
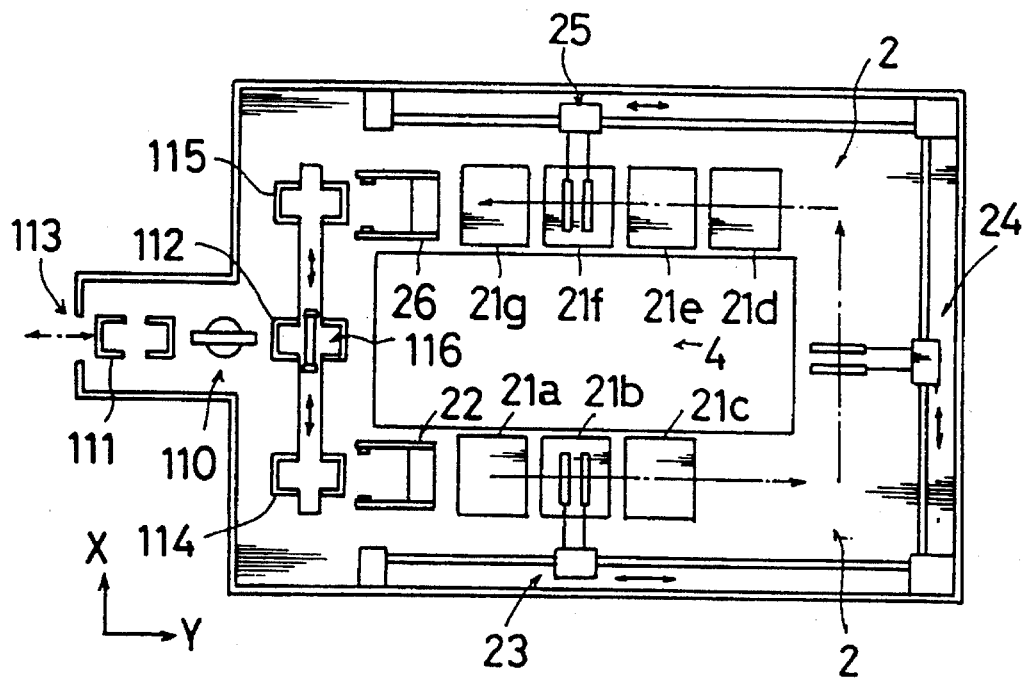
FIG. 18 is a plan view of an apparatus according to a seventh embodiment.

An apparatus according to the seventh embodiment of the present invention (FIG. 18) a single or common substrate transfer robot 110 for transferring substrates W to be cleaned from transport cassette 7 to processing cassette 8, and for transferring cleaned substrates W from processing cassette 8 to transport cassette 7. This substrate transfer robot 110 has the same construction as the loader substrate transfer robot 13 (or 100) shown in FIG. 6 (or FIG. 11). In FIG. 18, reference numerals 111 and 112 denote a depository for supporting a transport cassette 7 during a substrate transfer operation, and a depository for supporting a processing cassette 8 during a substrate transfer operation, respectively. These depositories 111 and 112 have the same construction as the depository 12 in the preceding embodiments. Further, reference numeral 113 denotes an inlet/outlet for allowing passage of incoming and outgoing transport cassettes 7, which has the same construction as the inlet 11 in the preceding embodiments. This embodiment further includes a transport robot 116 (having the same construction as the transport cassette transport robot 52 shown in FIG. 11) for transporting processing cassettes 8 between the depositories 112 and 114 and between the depositories 112 and 115. The components denoted by the other numerals in FIG. 18 are the same as in the preceding embodiments.

In the seventh embodiment, the substrate transfer robot 110 corresponds to the substrate transfer device of the present invention. The depository 111 corresponds to the transport cassette transfer station of the present invention, the depository 112 corresponds to the processing cassette transfer station of the present invention, the inlet/outlet 113 corresponds to the transport cassette delivery section of the present invention.

In the operation of this seventh embodiment, a transport cassette 7 storing substrates W to be cleaned is introduced through the inlet/outlet 113 in a turned sideways position, and placed as positioned sideways on the depository 111. At this time, a processing cassette 8 is present as sideways turned over on the depository 112. In this state, the substrate transfer robot 110 transfers the substrates W to be cleaned from the transport cassette 7 to the processing cassette 8. After the substrate transfer, the transport robot 116 transports the processing cassette 8 from the depository 112 to the depository 114.

With the depository 112 now vacated, the transport robot 116 transports a processing cassette 8 (storing cleaned substrates W) standing by on the depository 115, from the depository 115 to the depository 112. Then, the substrate transfer robot 110 transfers the cleaned substrates W from the processing cassette 8 to the transport cassette 7. The transport cassette 7 storing the cleaned substrates W is transported out of the apparatus through the inlet/outlet 113.

The processing cassette 8 transported by the transport robot 116 from the depository 112 to the depository 114 is stood upright by the posture change robot 22. The surface treatment robots 23, 24 and 25 transport the upright processing cassette 8, causing the substrates W stored in the processing cassette 8 to be cleaned and dried in the treating baths 21a–21g. The processing cassette 8 storing the cleaned and dried substrates W is turned over by the posture change robot 26 to lie on its side, and placed on the depository 115 for standby. The processing cassette 8 is left waiting for completion of an operation, if any, to transfer substrates W newly brought in for cleaning treatment to a processing cassette 8 placed on the depository 112. When the depository 111 becomes free, the transport robot 116 transports the processing cassette 8 storing the cleaned substrates W and standing by on the depository 115, from the depository 115 to the depository 112. Then, the substrate transfer robot 110 transfers the cleaned substrates W from the processing cassette 8 to the transport cassette 7. The transport cassette 7 storing the cleaned substrates W exits the apparatus through the inlet/outlet 113. The empty processing cassette 8, after the transfer, is used for receiving substrates W to be cleaned from a next incoming transport cassette 7.

The seventh embodiment fulfills at least the primary object of the present invention to provide surface treatment for a plurality of substrates W arranged with the optimal spacing in each processing cassette 8 without being governed by the storage spacing in the transport cassette 7.

The foregoing embodiments have been described, exemplifying the cleaning apparatus as surface treating apparatus. The present invention is equally applicable to apparatus for providing other surface treatments (such as etching and peeling) for a plurality of substrates stored in each cassette.

Further, while the foregoing embodiments have been described, exemplifying surface treatment of square glass substrates for liquid crystal displays, the present invention is applicable also to surface treatment of semiconductor wafers, masks, reticles and the like.

The present invention may be embodied in other specific forms without departing from the spirit or essential attributes thereof and, accordingly, reference should be made to the appended claims, rather than to the foregoing specification, as indicating the scope of the invention.

What is claimed is:

1. A surface treating apparatus for providing surface treatment to a plurality of substrates stored in a cassette, said apparatus comprising:

a transport cassette transfer station to support a transport cassette adapted to store the plurality of substrates arranged with a first storage spacing;

a processing cassette transfer station to support a processing cassette adapted to store the plurality of substrates arranged with a second storage spacing which is different from the first storage spacing;

substrate transfer means for transferring the plurality of substrates between said transport cassette at said transport cassette transfer station and said processing cassette at said processing cassette transfer station, such that said substrates are stored in said transport cassette and said processing cassette with said first storage spacing and said second storage spacing, respectively;

a surface treating section to provide surface treatment for the plurality of substrates stored in said processing cassette; and surface treatment transport means for transporting said processing cassette storing the plurality of substrates to be treated, after a substrate transfer by said substrate transfer means from said transport cassette to said processing cassette, from said processing cassette transfer station through said surface treating section to said processing cassette transfer station.

2. A surface treating apparatus as defined in claim 1, wherein said substrate transfer means includes;

substrate withdrawing and inserting means for horizontally withdrawing said substrates in succession from one of said transport cassette and said processing cassette, and horizontally inserting said substrates into the other of said transport cassette and said processing cassette; and vertical displacement means for vertically displacing said substrate withdrawing and inserting means.

3. A surface treating apparatus as defined in claim 1, wherein;

said transport cassette transfer station includes a transport cassette loader transfer station, and a transport cassette unloader transfer station;

said processing cassette transfer station includes a processing cassette loader transfer station and a processing cassette unloader transfer station;

said substrate transfer means includes loader substrate transfer means for transferring the plurality of substrates to be treated from said transport cassette at said transport cassette loader transfer station to an empty processing cassette at said processing cassette loader transfer station to be stored therein with said second storage spacing, and unloader substrate transfer means for transferring the plurality of treated substrates from said processing cassette at said processing cassette unloader transfer station to an empty transport cassette at said transport cassette unloader transfer station to be stored therein with said first storage spacing; and said surface treatment transport means is operable to transport said processing cassette storing the plurality of substrates to be treated, after the substrate transfer by said loader substrate transfer means, from said processing cassette loader transfer station through said surface treating section to said processing cassette unloader transfer station.

4. A surface treating apparatus as defined in claim 3, further comprising a transport cassette delivery section for passing said transport cassette storing the plurality of substrates between an exterior of said surface treating apparatus and said transport cassette transfer station;

said transport cassette delivery section including a transport cassette loader deliver section to pass said transport cassette storing the plurality of substrates to be treated between said exterior of said surface treating apparatus and said transport cassette loader transfer station, and a transport cassette unloader delivery section to pass said transport cassette storing the plurality of treated substrates between said exterior of said surface treating apparatus and said transport cassette unloader transfer station.

5. A surface treating apparatus as defined in claim 4, wherein said surface treatment transport means has a transport path with a transport direction turned back in an intermediate region, said transport cassette loader delivery section, said transport cassette loader transfer station, said loader substrate transfer means, said processing cassette loader transfer station, said surface treating section, said processing cassette unloader transfer station, said unloader substrate transfer means, said transport cassette unloader transfer station and said transport cassette unloader delivery section being arranged along said transport path.

6. A surface treating apparatus as defined in claim 3, further comprising:

a transport cassette buffer disposed between said transport cassette loader transfer station and said transport cassette unloader transfer station to maintain said empty transport cassette in standby; and transport cassette transport means for transporting said empty transport cassette, after the substrate transfer by said loader substrate transfer means, from said transport cassette loader transfer station through said transport cassette buffer to said transport cassette unloader transfer station.

7. A surface treating apparatus as defined in claim 6, wherein said transport cassette buffer includes a plurality of depositories arranged between said transport cassette loader transfer station and said transport cassette unloader transfer station;

said transport cassette transport means being operable to transport empty transport cassettes successively along said depositories toward said transport cassette unloader transfer station in accordance with use conditions (presence/absence of a transport cassette) of said transport cassette unloader transfer station.

8. A surface treating apparatus as defined in claim 6, wherein said transport cassette buffer includes a transport cassette cleaning section to clean said empty transport cassette, said empty transport cassette being cleaned in said transport cassette cleaning section while said transport cassette transfer means transports said empty transport cassette from said transport cassette loader transfer station to said transport cassette unloader transfer station.

9. A surface treating apparatus as defined in claim 3, further comprising:

a processing cassette buffer disposed between said processing cassette loader transfer station and said processing cassette unloader transfer station to maintain said empty processing cassette in standby; and processing cassette transport means for transporting said empty processing cassette, after the substrate transfer by said unloader substrate transfer means, from said processing cassette unloader transfer station through said processing cassette buffer to said processing cassette loader transfer station.

10. A surface treating apparatus as defined in claim 9, wherein said processing cassette buffer includes a plurality of depositories arranged between said processing cassette loader transfer station and said processing cassette unloader transfer station;

said processing cassette transport means being operable to transport empty processing cassettes successively along said depositories toward said processing cassette loader transfer station in accordance with use conditions (presence/absence of a processing cassette) of said processing cassette loader transfer station.

11. A surface treating apparatus as defined in claim 9, wherein said processing cassette buffer incudes a processing cassette cleaning section to clean said empty processing cassette, said empty processing cassette being cleaned in said processing cassette cleaning section while said processing cassette transfer means transports said empty processing cassette from said processing cassette unloader transfer station to said processing cassette loader transfer station.

12. A surface treating method for providing surface treatment to a plurality of substrates stored in a cassette, said method comprising the steps of:

transferring the plurality of substrates to be treated, which are stored in a transport cassette with a first storage spacing, from said transport cassette to an empty processing cassette to be stored therein with a second storage spacing which is different from the first storage spacing;

transporting said processing cassette, after transfer of said substrates to be treated, to a surface treating section for providing surface treatment of the plurality of substrates in said processing cassette; and transferring the plurality of treated substrates from said processing cassette to an empty transport cassette to be stored therein with said first storage spacing.

13. A surface treating method as defined in claim 12, wherein said step of transferring the substrates to be treated includes the steps of:

withdrawing one of said substrates to be treated, horizontally from said transport cassette;

displacing said one substrate to be treated, vertically to absorb a difference in height between a withdrawal position for withdrawing said one substrate to be treated, from said transport cassette, and a storage position for storing said one substrate to be treated, in said processing cassette;

storing said one substrate to be treated, in said storage position in said processing cassette; and repeating the above steps for each remaining substrate to be treated, stored in said transport cassette; and wherein said step of transferring the treated substrates includes the steps of:

withdrawing one of said treated substrates horizontally from said processing cassette;

displacing said one treated substrate vertically to absorb a difference in height between a withdrawal position for withdrawing said one treated substrate from said processing cassette and a storage position for storing said one treated substrate in said transport cassette;

storing said one treated substrate in said storage position in said transport cassette; and repeating the above steps for each remaining treated substrate stored in said processing cassette.

14. A surface treating method as defined in claim 12, wherein said step of transferring the substrates to be treated is executed to transfer the plurality of substrates to be treated, which are stored in said transport cassette with said first storage spacing, from said transport cassette at a transport cassette loader transfer station to said empty processing cassette at a processing cassette loader transfer station to be stored therein with said second storage spacing;

said step of transporting said processing cassette and providing surface treatment for said substrates is executed to transport said processing cassette having received the plurality of substrates to be treated, from said processing cassette loader transfer station to a processing cassette unloader transfer station different from said processing cassette loader transfer station while providing surface treatment for the plurality of substrates along with said processing cassette in said surface treating section; and said step of transferring said treated substrates is executed to transfer the plurality of treated substrates from said processing cassette transported to said processing cassette unloader transfer station, to said empty transport cassette at said transport cassette unloader transfer station different from said transport cassette loader transfer station, to be stored in said empty transport cassette with said first storage spacing.

15. A surface treating method as defined in claim 14, wherein said step of transferring the substrates to be treated is preceded by the step of introducing said transport cassette storing the plurality of substrates to be treated from outside a surface treating apparatus into said transport cassette loader transfer station, and said step of transferring the treated substrates is followed by the step of transporting said transport cassette storing the plurality of treated substrates from said transport cassette unloader transfer station outwardly of said surface treating apparatus.

16. A surface treating method as defined in claim 14, further comprising the step of transporting said empty transport cassette, after the substrate transfer at said step of transferring the substrates to be treated, from said transport cassette loader transfer station through a transport cassette buffer for maintaining said empty transport cassette in standby to said transport cassette unloader transfer station, said substrates transporting step being executed in parallel with said step of transporting said processing cassette and providing surface treatment for said substrates.

17. A surface treating method as defined in claim 16, wherein said step of transporting said empty transport cassette includes the step of cleaning said empty transport cassette.

18. A surface treating method as defined in claim 14, further comprising the step of transporting said empty processing cassette, after the substrate transfer at said step of transferring the treated substrates, from said processing cassette unloader transfer station through a processing cassette buffer for maintaining said empty processing cassette in standby to said processing cassette loader transfer station.

19. A surface treating method as defined in claim 18, wherein said step of transporting said empty processing cassette includes the step of cleaning said empty processing cassette.

20. A surface treating apparatus for providing surface treatment for a plurality of substrates stored in a cassette, said apparatus comprising:

a transport cassette transfer station to support a transport cassette adapted to store the plurality of substrates arranged with a first storage spacing;

a processing cassette transfer station to support a processing cassette adapted to store the plurality of substrates arranged with a second storage spacing which is different from the first storage spacing;

substrate transfer device for transferring the plurality of substrates between said transport cassette at said transport cassette transfer station and said processing cassette at said processing cassette transfer station, such that said substrates are stored in said transport cassette and said processing cassette with said first storage spacing and said second storage spacing, respectively;

a surface treating section to provide surface treatment for the plurality of substrates stored in said processing cassette; and surface treatment transport device to transport said processing cassette storing the plurality of substrates to be treated, after a substrate transfer by said substrate transfer device from said transport cassette to said processing cassette, from said processing cassette transfer station through said surface treating section to said processing cassette transfer station.

21. A surface treating apparatus as defined in claim 20, wherein said substrate transfer means includes;

substrate withdrawing and inserting device to horizontally withdraw said substrates in succession from one of said transport cassette and said processing cassette, and horizontally inserting said substrates into the other of said transport cassette and said processing cassette; and vertical displacement device to vertically displace said substrate withdrawing and inserting device.

22. A surface treating apparatus as defined in claim 20, wherein;

said transport cassette transfer station includes a transport cassette loader transfer station, and a transport cassette unloader transfer station;

said processing cassette transfer station includes a processing cassette loader transfer station and a processing cassette unloader transfer station;

said substrate transfer device includes loader substrate transfer device to transfer the plurality of substrates to be treated from said transport cassette at said transport cassette loader transfer station to be stored therein with said second storage spacing, and unloader substrate transfer device to transfer the plurality of treated substrates from said processing cassette at said processing cassette unloader transfer station to an empty transport cassette at said transport cassette unloader transfer station to be stored therein with said first storage spacing; and said surface treatment transport device is operable to transport said processing cassette storing the plurality of substrates to be treated, after the substrate transfer by said loader substrate transfer means, from said processing cassette loader transfer station through said surface treating section to said processing cassette unloader transfer station.

23. A surface treating apparatus as defined in claim 22, further comprising:

a transport cassette buffer disposed between said transport cassette loader transfer station and said transport cassette unloader transfer station to maintain said empty transport cassette in standby; and transport cassette transport device to transport said empty transport cassette, after the substrate transfer by said loader substrate transfer device, from said transport cassette loader transfer station through said transport cassette buffer to said transport cassette unloader transfer station.

24. A surface treating apparatus as defined in claim 23, wherein said transport cassette buffer includes a transport cassette cleaning section to clean said empty transport cassette, said empty transport cassette being cleaned in said transport cassette cleaning section while said transport cassette transfer device transports said empty transport cassette from said transport cassette loader transfer station to said transport cassette unloader transfer station.

25. A surface treating apparatus as defined in claim 23, wherein said transport cassette buffer includes a plurality of depositories arranged between said transport cassette loader transfer station and said transport cassette unloader transfer station;

said transport cassette transport device being operable to transport empty transport cassettes successively along said depositories toward said transport cassette unloader transfer station in accordance with use conditions (presence/absence of a transport cassette) of said transport cassette unloader transfer station.

26. A surface treating apparatus as defined in claim 22, further comprising:

a processing cassette buffer disposed between said processing cassette loader transfer station and said processing cassette unloader transfer station to maintain said empty processing cassette in standby; and processing cassette transport device to transporting said empty processing cassette, after the substrate transfer by said unloader substrate transfer device, from said processing cassette unloader transfer station through said processing cassette buffer to said processing cassette loader transfer station.

27. A surface treating apparatus as defined in claim 26, wherein said processing cassette buffer includes a plurality of depositories arranged between said processing cassette loader transfer station and said processing cassette unloader transfer station;

said processing cassette transport device being operable to transport empty processing cassettes successively along said depositories toward said processing cassette loader transfer station in accordance with use conditions (presence/absence of a processing cassette) of said processing cassette loader transfer station.

28. A surface treating apparatus as defined in claim 26, wherein said processing cassette buffer includes a processing cassette cleaning section to clean said empty processing cassette, said empty processing cassette being cleaned in said processing cassette cleaning section while said processing cassette transfer device transports said empty processing cassette from said processing cassette unloader transfer station to said processing cassette loader transfer station.

* * * * *